(12) United States Patent
Ammar

(10) Patent No.: US 7,603,088 B2
(45) Date of Patent: Oct. 13, 2009

(54) MULTI-CHANNEL RADIOMETER IMAGING SYSTEM AND MMIC CHIPS FOR USE THEREOF

(75) Inventor: Danny F. Ammar, Windermere, FL (US)

(73) Assignee: Reveal Imaging, LLC, Bedford, MA (US)

( * ) Notice: Subject to any disclaimer, the term of this patent is extended or adjusted under 35 U.S.C. 154(b) by 588 days.

(21) Appl. No.: 11/301,385

(22) Filed: Dec. 13, 2005

(65) Prior Publication Data
US 2006/0121873 A1 Jun. 8, 2006

Related U.S. Application Data

(63) Continuation-in-part of application No. 10/995,952, filed on Nov. 23, 2004, now Pat. No. 7,088,086, which is a continuation-in-part of application No. 10/847,892, filed on May 18, 2004, now Pat. No. 7,034,516.

(60) Provisional application No. 60/504,182, filed on Sep. 18, 2003.

(51) Int. Cl.
*H04B 17/00* (2006.01)
*H04Q 11/12* (2006.01)
*G01S 3/02* (2006.01)

(52) U.S. Cl. .............. 455/67.15; 455/127.3; 455/67.11; 324/76.14; 342/351

(58) Field of Classification Search ................. 455/454, 455/67.15, 253.2, 67.11, 63.1, 67.16; 324/76.11, 324/76.12, 76.13, 76.14; 342/351
See application file for complete search history.

(56) References Cited

U.S. PATENT DOCUMENTS

| 3,693,095 | A | 9/1972 | Wilt | 324/363 |
|---|---|---|---|---|
| 3,725,930 | A | 4/1973 | Caruso, Jr. | 343/100 |
| 3,777,270 | A | 12/1973 | Hardy et al. | 325/363 |
| 4,521,861 | A | 6/1985 | Logan et al. | 364/517 |
| 4,557,272 | A | 12/1985 | Carr | 128/736 |
| 4,724,439 | A | 2/1988 | Wiley et al. | 342/351 |
| RE33,791 | E | 1/1992 | Carr | 374/122 |
| 5,149,198 | A | 9/1992 | Sterzer | 374/139 |
| 5,198,776 | A | 3/1993 | Carr | 324/639 |
| 5,202,692 | A | 4/1993 | Huguenin et al. | 342/179 |
| 5,239,685 | A | 8/1993 | Moe et al. | 455/73 |
| 5,248,977 | A | 9/1993 | Lee et al. | 342/25 |
| 5,438,336 | A | 8/1995 | Lee et al. | 342/174 |
| 5,815,113 | A | 9/1998 | Lo et al. | 342/351 |

(Continued)

FOREIGN PATENT DOCUMENTS

GB  2 211 952  12/1989

OTHER PUBLICATIONS

Nakano, et al., "A Broadband Microwave Radiometer Using Correlation Technique," IEEE Transactions on Instrumentation and Measurement, IEEE Inc., vol. 48, No. 2, Apr. 1999, pp. 631-633.

*Primary Examiner*—Sonny Trinh
(74) *Attorney, Agent, or Firm*—Mintz, Levin, Cohn, Ferris, Glovsky and Popeo, P.C.

(57) ABSTRACT

A MMIC includes at least one quadrature hybrid in a plurality of series connected amplifiers connected in two parallel gain stages and operatively connected to the at least one quadrature hybrid such that gain is equalized in the two parallel gain stages.

6 Claims, 20 Drawing Sheets

U.S. PATENT DOCUMENTS

| | | | |
|---|---|---|---|
| 5,949,845 A | 9/1999 | Sterzer | 378/37 |
| 5,986,518 A * | 11/1999 | Dougherty | 333/117 |
| 5,999,121 A | 12/1999 | Salonen | 342/351 |
| 6,052,024 A | 4/2000 | Lo et al. | 330/53 |
| 6,414,606 B1 | 7/2002 | Yujiri et al. | 340/901 |
| 6,439,763 B2 | 8/2002 | Roeder et al. | 374/1 |
| 6,647,350 B1 | 11/2003 | Palfenier et al. | 702/134 |
| 6,777,684 B1 * | 8/2004 | Volkov et al. | 250/341.1 |
| 6,844,715 B2 | 1/2005 | Hoffmann | 324/76.13 |
| 7,199,570 B2 * | 4/2007 | Ammar | 324/76.14 |
| 7,211,139 B2 * | 5/2007 | Robertson et al. | 106/497 |
| 7,239,122 B2 * | 7/2007 | Ammar | 324/76.14 |
| 7,250,747 B1 * | 7/2007 | Ammar | 324/76.14 |
| 2003/0013284 A1 * | 1/2003 | Emrick et al. | 438/575 |
| 2003/0025486 A1 | 2/2003 | Ellis et al. | 324/76.14 |
| 2004/0057496 A1 | 3/2004 | Roeder | 374/129 |
| 2004/0066327 A1 | 4/2004 | Salmon | 342/351 |
| 2006/0164064 A1 * | 7/2006 | Ammar | 324/76.14 |

* cited by examiner

NOISE BW (MHZ) = 20000
TEMP (DEG K)      300
INTEG. TIME (SEC) 0.010

| COMMENT | AMBIENT | ANTENNA | MANIFOLD INTERFACE | WGT | SWITCH | LNA | LNA | LNA | FILTER | DETECTOR |
|---|---|---|---|---|---|---|---|---|---|---|
| GAIN/LOSS (DB) |  | -2.00 | -2.00 | -1.00 | -2.00 | 17.00 | 17.00 | 17.00 | -5.00 | 0.00 |
| NOISE FIGURE (DB) |  | 2.00 | 2.00 | 1.00 | 2.00 | 5.00 | 5.00 | 5.00 | 5.00 | 0.00 |
| NOISE TEMP | 300 | 169.6 | 169.6 | 75.1 | 169.6 | 627.1 | 627.1 | 627.1 | 627.1 | 0.0 |
| CUM GAIN |  | -2 | -4.00 | -5.00 | -7.00 | 10.00 | 27.00 | 44.00 | 39.00 | 39.00 |
| CUM NF |  | 2 | 4.0 | 5.0 | 7.0 | 12.0 | 12.1 | 12.1 | 12.1 | 12.1 |
| CUM TEMP | 300.0 | 469.6 | 438.4 | 627.1 | 1163.4 | 4306.3 | 4369.0 | 4370.3 | 4370.3 | 4370.3 |

| SENSITIVITY (DEG K) | 0.6 |
|---|---|

*FIG. 10*

NOISE BW (MHZ) = 20000
TEMP (DEG K)      300
INTEG. TIME (SEC) 0.010

| COMMENT | AMBIENT | ANTENNA | WGT | HYBRID | LNA | MICROSTRIP | LNA | MICROSTRIP | LNA | FILTER | DETECTOR |
|---|---|---|---|---|---|---|---|---|---|---|---|
| GAIN/LOSS (DB) |  | -2.00 | -0.70 | -0.70 | 17.00 | -0.70 | 17.00 | -0.70 | 17.00 | -5.00 | 0.00 |
| NOISE FIGURE (DB) |  | 2.00 | 0.70 | 0.70 | 5.00 | 0.70 | 5.00 | 0.70 | 5.00 | 5.00 | 0.00 |
| NOISE TEMP | 300 | 169.6 | 50.7 | 50.7 | 627.1 | 50.7 | 627.1 | 50.7 | 627.1 | 627.1 | 0.0 |
| CUM GAIN |  | -2 | -2.70 | -3.40 | 13.60 | 12.90 | 29.90 | 29.20 | 46.20 | 41.20 | 41.20 |
| CUM NF |  | 2 | 2.7 | 3.4 | 8.4 | 8.4 | 8.5 | 8.5 | 8.5 | 8.5 | 8.5 |
| CUM TEMP | 300.0 | 469.6 | 250.0 | 344.5 | 1716.4 | 1718.6 | 1750.7 | 1750.8 | 1751.5 | 1751.6 | 1751.6 |

| SENSITIVITY (DEG K) | 0.12 |
|---|---|

*FIG. 11*

| DICKE | AMBIENT | HORN | WGT | SWITCH | LNA | LNA | FILTER | LNA | DETECTOR |
|---|---|---|---|---|---|---|---|---|---|
| GAIN/LOSS (DB) |  | -0.30 | -0.70 | -2.00 | 16.00 | 16.00 | -5.00 | 16.00 | 0.00 |
| NOISE FIGURE (DB) |  | 0.30 | 1.00 | 2.00 | 5.50 | 5.50 | 5.00 | 5.50 | 0.00 |
| NOISE TEMP | 300 | 20.7 | 75.1 | 169.6 | 739.0 | 739.0 | 627.1 | 739.0 | 0.0 |
| CUM GAIN |  | -0.3 | -1.00 | -3.00 | 13.00 | 29.00 | 24.00 | 40.00 | 40.00 |
| CUM NF |  | 0.3 | 1.3 | 3.2 | 8.6 | 8.6 | 8.6 | 8.6 | 8.6 |
| CUM TEMP | 300.0 | 320.7 | 401.2 | 614.7 | 2089.2 | 2126.2 | 2127.0 | 2129.9 | 2129.9 |

| HYBRID | AMBIENT | HORN | WGT | LNA | U-STRIP | LNA | FILTER | LNA | U-STRIP | DETECTOR |
|---|---|---|---|---|---|---|---|---|---|---|
| GAIN/LOSS (DB) | | -0.30 | -0.70 | 16.00 | -0.70 | 16.00 | -5.00 | 16.00 | 0.70 | 0.00 |
| NOISE FIGURE (DB) | | 0.30 | 0.70 | 5.50 | 0.70 | 5.50 | 5.00 | 5.50 | 0.70 | 0.00 |
| NOISE TEMP | 300 | 20.7 | 50.7 | 739.0 | 50.7 | 739.0 | 627.1 | 739.0 | 50.7 | 0.0 |
| CUM GAIN | | -0.3 | -1.00 | 15.00 | 14.30 | 30.30 | 25.30 | 41.30 | 42.00 | 42.00 |
| CUM NF | | 0.3 | 1.0 | 6.5 | 6.5 | 6.6 | 6.6 | 6.6 | 6.6 | 6.6 |
| CUM TEMP | 300.0 | 320.7 | 375.1 | 1305.4 | 1307.0 | 1334.4 | 1335.0 | 1337.2 | 1337.2 | 1337.2 |

FIG. 14

| HYBRID/SWITCH | AMBIENT | HORN | WGT | LNA | SWITCH | U-STRIP | LNA | FILTER | LNA | DETECTOR |
|---|---|---|---|---|---|---|---|---|---|---|
| GAIN/LOSS (DB) | | -0.30 | -0.70 | 16.00 | -2.00 | -0.70 | 16.00 | -5.00 | 16.00 | 0.00 |
| NOISE FIGURE (DB) | | 0.30 | 0.70 | 5.50 | 2.00 | 0.70 | 5.50 | 5.00 | 5.50 | 0.00 |
| NOISE TEMP | 300 | 20.7 | 50.7 | 739.0 | 169.6 | 50.7 | 739.0 | 627.1 | 739.0 | 0.0 |
| CUM GAIN | | -0.3 | -1.00 | 15.00 | 13.00 | 12.30 | 28.30 | 23.30 | 39.30 | 39.30 |
| CUM NF | | 0.3 | 1.0 | 6.5 | 6.5 | 6.5 | 6.7 | 6.7 | 6.7 | 6.7 |
| CUM TEMP | 300.0 | 320.7 | 375.1 | 1305.4 | 1310.7 | 1313.3 | 1356.8 | 1357.7 | 1361.2 | 1361.2 |

FIG. 15

MULTI-CHANNEL RADIOMETER IMAGING SYSTEM AND MMIC CHIPS FOR USE THEREOF

RELATED APPLICATIONS

This application is a continuation-in-part of commonly assigned patent application Ser. No. 10/995,952 filed Nov. 23, 2004, now U.S Pat. No. 7,088,086 which is a continuation-in-part of commonly-assigned patent application Ser. No. 10/847,892 filed May 18, 2004, now U.S. Pat. No. 7,034,516 which is based on provisional application Ser. No. 60/504,182 filed Sep. 18, 2003, the disclosures which are hereby incorporated by reference in their entirety.

FIELD OF THE INVENTION

The present invention relates to the field of focal plane radiometers, and more particularly, the present invention relates to MMIC chips and their use in radiometer systems applicable for use at millimeter wave (MMW) frequencies.

BACKGROUND OF THE INVENTION

Since radio waves may be considered infrared radiation of long wave, a hot body would be expected to radiate microwave energy thermally. In order to be a good radiator of microwave energy, a body must be a good absorber. The best thermal radiator is a "black body." The amount of radiation emitted in the MMW range is $10^8$ times smaller than the amount emitted in the infrared range. Current MMW receivers, however, have at least $10^5$ times better noise performance than infrared detectors, and with some temperature contrast, the remaining $10^3$ may be recovered. This makes passive MMW imaging comparable in performance with current infrared systems. This unique characteristic makes MMW radiometers a popular choice for sensing thermal radiation. MMW radiometers have been used in many different applications such as remote terrestrial and extra-terrestrial sensing, medical diagnostics and defense applications. MMW electromagnetic radiation windows occur at 35 GHz, 94 GHz, 140 GHz and 220 GHz. The choice of frequency depends on specific applications.

Focal plane arrays are used to form images from radiation received by a reflector antenna. Millimeter wave (MMW) focal plane array radiometers also have been used in many applications to form images based on thermal sensing of radiated microwave energy. The sensitivity of existing radiometer designs, however, has been limited to about 1 deg K, resulting in poor images.

The principle of operation of the radiometric technique is fully described in the literature. The design of a typical radiometer is based on the technique of comparing the level of electromagnetic noise emitted by an unknown source to a reference or stable noise source. This technique and devices were initially proposed by Dicke [R. H. Dicke, "The Measurement of Thermal Radiation at Microwave Frequencies," The Review of Scientific Instruments, Vol. 17, No. 7, Jul. 1946].

In a Dicke radiometer circuit, the signals from an antenna are sampled and compared with signals from a reference source maintained at a known constant temperature. This overcomes some of the problems of amplifier instability, but in general does not alter effects resulting from imperfect components and thermal gradients.

While other types of radiometric devices have been used with some success, the Dicke (or comparison) type of radiometer has been the most widely used for the study of relatively low level noise-like MMW signals, especially where the noise signals to be examined are often small in comparison to the internally generated noise level within the radiometer receiver. While there are several types of comparison radiometers, one popular type of radiometer for use in the microwave/millimeter wave frequency bands is that in which an incoming signal to be measured and a standard or calibrated reference noise signal are compared. This type of radiometer consists essentially of the comparison of the amplitude of an unknown noise signal coming from the source to be examined with a known amplitude of a noise signal from a calibration source. This method has been found useful in measuring with considerable accuracy the effective temperature of an unknown source.

In the Dicke or comparison type radiometer, the receiver input is switched between the antenna and a local reference signal noise generator. The detected and amplified receiver output is coupled to a phase-sensing detector operated in synchronism with the input switching. The output signal from such a radiometer receiver is proportionate to the difference between the temperature of the reference signal source and the temperature of the source viewed by the antenna inasmuch as the phase-sensing detector acts to subtract the background or internal noise of the receiver.

A Dicke radiometer uses an RF switch coupled between an antenna and a radiometer receiver, allowing the receiver to alternate between the antenna and a known reference load termination. The receiver output is connected to a synchronous detector that produces an output voltage proportional to a difference between the antenna and the reference temperature. Null balance operation for the Dicke radiometer has been achieved by coupling in noise from a hot noise diode to the antenna port of the RF switch thereby enabling matching the temperature from standard reference loads.

The sensitivity of radiometer measurements are also often limited by random gain fluctuations in the RF front end, low frequency noise (1/f), and bias in the detector circuits. Over the last decades many special techniques, including Dicke switching, have been implemented to reduce measurement errors. Many of these proposals do not yield a true solution that will allow MMW radiometers to be commercially viable. In addition, the high cost of MMW RF receivers has limited the number of channels in the radiometer to a low number, resulting in a requirement to scan both azimuth and elevation to create an image.

The invention disclosed in the commonly assigned and incorporated by reference patent application Ser. No. 10/847,892 eliminates the need for a Dicke switch and does not use a synchronizing circuit because it uses the source and reference all the time, and runs the source and reference signal through the amplifiers. It used a balanced channel approach and MMIC chips. Thus, a radiometer channel can be implemented by the use of either a single millimeter wave monolithic integrated circuit (MMIC) or through discrete implementation using printed hybrids and multiple MMIC low noise amplifiers (LNA's).

This compact radiometer as disclosed can fit directly into the antenna focal plane. A quadrature hybrid network is used in the front end to distribute RF input signals and reference signals to a balanced amplifier chain, thereby reducing gain variations and improving radiometer sensitivity. A balanced detector diode circuit, for example, a pair of diodes in one non-limiting example, eliminates drift errors introduced by a detector diode as a function of temperature.

A video signal chopper amplifier circuit, also referred to by some as an auto zero amplifier, eliminates bias introduced by the video amplifier. A near perfect channel-to-channel matching exists through the use of quadrature hybrid network or through digital signal processing corrections. This hybrid radiometer provides improved sensitivity over the Dicke radiometer.

This radiometer system, however, requires processing of two channels, i.e., the antenna and reference, resulting in higher system complexity and cost. It would be advantageous to provide a radiometer design that could combine features of the different radiometers to achieve low system temperature and low implementation costs.

In the co-pending Ser. No. 10/995,952 application, a combination of hybrid, low noise amplifiers (LNA's) and a switch achieve low system temperature and low implementation cost. The switch is positioned after a low noise amplifier. This design eliminates the impact of the switch losses in a MMIC chip application. Additionally, MMIC chips are disclosed in both pending patent applications. These chips can be formed to have a quadrature hybrid as an input having at least one radio frequency (RF) input and parallel signal path outputs. At least one amplifier can be connected to each signal path output of the quadrature hybrid. A quadrature hybrid as an output can be connected to at least one amplifier that has parallel RF outputs. The amplifiers provide equalized amplifier gain.

In another type of MMIC, a quadrature hybrid can have an input having at least one radio frequency (RF) input and parallel signal path outputs. At least one amplifier is connected at each signal path output of the quadrature hybrid. Another quadrature hybrid is connected to at least one amplifier at each signal path and has a parallel RF outputs. The amplifiers provide equalized amplifier gain. A switch is connected to the parallel RF output to the quadrature hybrid and selects one of the RF outputs of the quadrature hybrid and provides a signal RF output. The MMIC can also be formed as a plurality of amplifiers serially connected along a signal path. A detector can be connected to the series connected amplifiers for detecting an output there from. The detector can also be operatively connected to the switch that's connected to the parallel RF outputs. It is possible to have other MMIC chip designs for use in radiometers.

SUMMARY OF THE INVENTION

A MMIC includes at least one quadrature hybrid and a plurality of series connected amplifiers connected in two parallel gain stages and operatively connected to the at least one quadrature hybrid such that gain is equalized in the two parallel gain stages.

In another aspect, an input quadrature hybrid can be operatively connected to the plurality of series connected amplifiers and receive signals and pass signals to the series connected amplifiers. The input quadrature hybrid can have at least one radio frequency input. First and second RF inputs can be located at the input quadrature hybrid.

In yet another aspect, an RF input and load input can be located at the input quadrature hybrid. An output quadrature hybrid can be operatively connected to the series connected amplifiers for receiving amplified signals therefrom. At least one RF output can be located at the output quadrature hybrid. In yet another aspect, a load and RF air bridge can be operative with at least one RF output at the output quadrature hybrid.

In yet another aspect, a detector circuit can be operatively connected to the at least one RF output for producing a detected output. First and second RF outputs can be located at the output quadrature hybrid and a switch connected to the first and second RF outputs or selecting between first and second RF outputs. A detector circuit is operatively connected to the switch for producing a detected output. At least one amplifier is operatively connected to the switch and detector circuit.

In yet another aspect of the present invention, a MMIC circuit includes a first MMIC having an input quadrature hybrid and dual RF inputs in a plurality of series connected amplifiers connected in two parallel gain stages to the input quadrature hybrid and forming dual RF outputs. A second MMIC is operatively connected to the dual RF outputs of the first MMIC and is formed as a plurality of series connected amplifiers connected in two parallel gain stages to the dual RF outputs of the first MMIC. An output quadrature hybrid is operatively-connected to the series connected amplifiers and has at least one output. Gain is equalized by the two parallel gain stages and first and second MMIC's. A ribbon bond can connect the dual RF outputs of the first MMIC and the series connected amplifiers of the second MMIC.

In yet another aspect of the present invention, the MMIC can be formed as a switch having first and second radio frequency inputs. A plurality of series connected amplifiers are operatively connected to the switch and produce a single amplified output signal. A detector circuit can be operatively connected to the series connected amplifiers for producing a detected RF output. The RF input of a switch can include a load connected thereto.

BRIEF DESCRIPTION OF THE DRAWINGS

Other objects, features and advantages of the present invention will become apparent from the detailed description of the invention which follows, when considered in light of the accompanying drawings in which:

FIG. 10 is a chart showing Dicke radiometer sensitivity of the type shown in FIG. 2.

FIG. 11 is a chart showing the radiometer sensitivity of the present invention.

FIG. 14 is a chart showing radiometer system noise performance of a hybrid radiometer system.

FIG. 15 is a chart showing the radiometer system noise performance for a hybrid/switch radiometer of the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
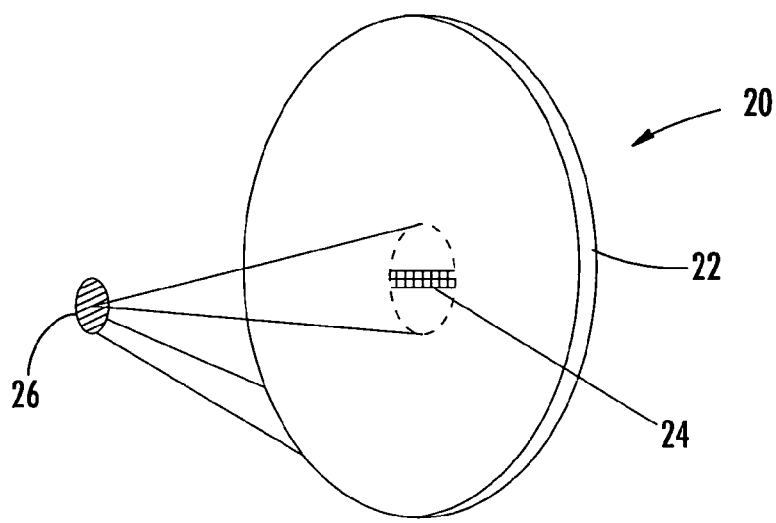
FIG. 1 is a fragmentary environmental view of a typical radiometer antenna system for a focal plane array.

FIG. 1 shows a typical radiometer antenna system 20. The main antenna 22 collects temperature data or other pertinent data to be analyzed. The data is focused in the middle of the antenna at the focal plane array 24 using a sub-reflector 26.

Figure 2:
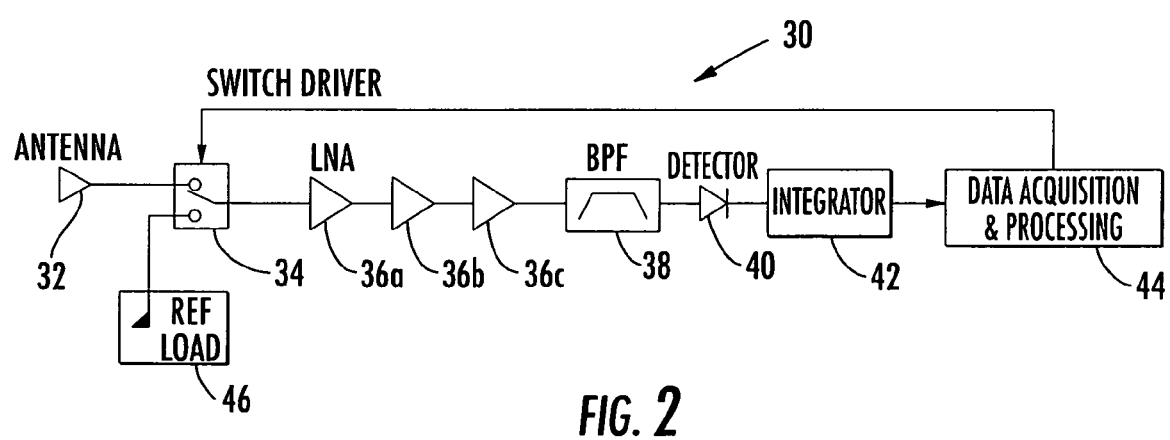
FIG. 2 is a block diagram showing a receiver front end in a typical radiometer system.

FIG. 2 shows a common prior art "Dicke" type radiometer system 30, including a receiver front end. In a Dicke radiometer, generally a receiving circuit detects weak signals in noise and modulates these signals at an input. The circuit demodulates the signals and compares the output with a reference from the modulator. Coincidence indicates a signal presence. For example, microwave noise power can be measured by comparing it with the noise from a standard source in a waveguide.

In this illustrated example of a Dicke radiometer, the antenna 32 senses target temperature, which is proportional to the radiated target energy. The energy passes through a Dicke switch 34 of the type known to those skilled in the art and into a series of MMIC amplifiers 36a, 36b, 36c. A band pass filter 38 sets the receiver bandwidth. A square law detector 40 detects the signal and passes it to an integrator 42, which sums the signal over an observation period. A data acquisition and processing circuit 44 receives the integrated signal, where it is digitized, compensated for gain variation, and processed for display on a video or for further processing. To cancel the effects of gain variation, the Dicke switch 34 samples a reference source 46. Gain variations in the receiver are cancelled using the measured reference gain.

Radiometer sensitivity is important. The precision in estimating the measured temperature is often referred to as the radiometer sensitivity, $\Delta T$. This parameter is a key quantity characterizing the performance of a MMW radiometer. In radiometer terminology, this is the smallest change in temperature that can be detected by the radiometer. The equation, which derives the sensitivity of the system 30 shown in FIG. 2 is:

$$P_{sys} = P_A + P_{rec}$$

where $P_{sys}$=total input power
$P_A$=Noise power at the antenna=$k\,T_A\,B$
$P_{rec}$=Noise power generated in the receiver=$kT_{rec}B$
K=Boltzmann's constant
B=receiver bandwidth Assuming a square law detector, the radiometer output voltage is an average value of the radiometer output noise power. The square law detector can have an output proportional to the square of the applied voltage, e.g., the output is proportional to the square of the input amplitude. A radiometer output voltage is:

$$V_{out} = P_{sys} \times G_{sys}$$

where $G_{sys}$ is the receiver gain.

Assuming that $G_{sys}$ and $T_{rec}$ are constant, the radiometer sensitivity is:

$$\Delta T_{ideal} = (1/\sqrt{B\tau})T_{sys}$$

where $\tau$ is the integration time.

In most applications, however, $G_{sys}$ and $T_{rec}$ are not constant, and their variations cause degradation of the radiometer sensitivity as follows:

Gain variations effects:

$$\Delta T_G = (T_A - T_{ref}) \times (\Delta G_{sys}/G_{sys})$$

Assuming a five degree difference between the antenna temperature and the reference temperature, a ±3 dB gain variation (over the 3 LNA's 36a, 36b, 36c), and a 40 dB total system gain, the radiometer sensitivity will vary by about 5%.

Temperature variation effects can be shown:

$$\Delta T_{ant} = (T_A + T_{rec})/(\sqrt{B\tau/2}) = \sqrt{2}(T_A + T_{rec})/(\sqrt{B\tau})$$

$$\Delta T_{ref} = (T_{ref} + T_{rec})/(\sqrt{B\tau/2}) = \sqrt{2}(T_{ref} + T_{rec})/(\sqrt{B\tau})$$

Assuming statistical independence, the temperature variation can be shown:

$$\Delta T = [(\Delta T_G)^2 + (\Delta T_{ant})^2 + (\Delta T_{ref})^2]^{1/2}$$

$$= \left[\frac{[2(T_A + T_{rec})^2 + 2(T_{ref} + T_{rec})^2]}{(B\tau)^{1/2}} + (\Delta G_{sys}/G_{sys})^2(T_A - T_{ref})^2\right]^{1/2}$$

Assuming a balanced Dicke radiometer (i.e. $T_A = T_{ref}$), the above equation can be simplified to:

$$\Delta T = 2(T_A + T_{rec})/\sqrt{B\tau}$$
$$= 2\Delta T_{ideal}$$

Therefore, the Dicke radiometer sensitivity is twice that of an ideal total power radiometer. The factor of two (2) comes about because the Dicke switch alternates between the reference and the antenna such that $T_A$ is observed for only half of the time.

Figure 2A:
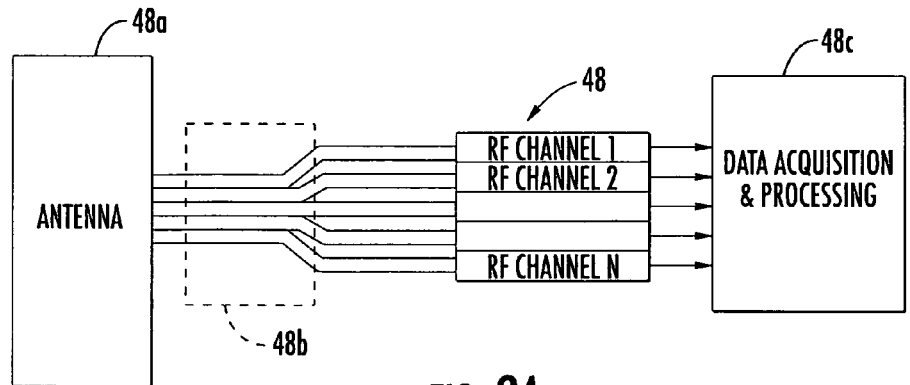
FIG. 2A is a block diagram showing how radiometer modules are typically connected to the antenna with a waveguide manifold in current art.

FIG. 2A shows how the radiometer channels 48, indicated as channels 1 . . . N, as part of RF modules, are typically connected to the antenna 48a. Because of the large size of the radiometer RF modules, which cannot fit directly in the antenna focal plane, a waveguide manifold 48b is used to connect the modules to the focal plane. The waveguide manifold 48b increases the front end losses by at least 2 dB, resulting in reduced radiometer sensitivity. The channels 48 connect to data acquisition and processing circuit 48c.

Figure 3:
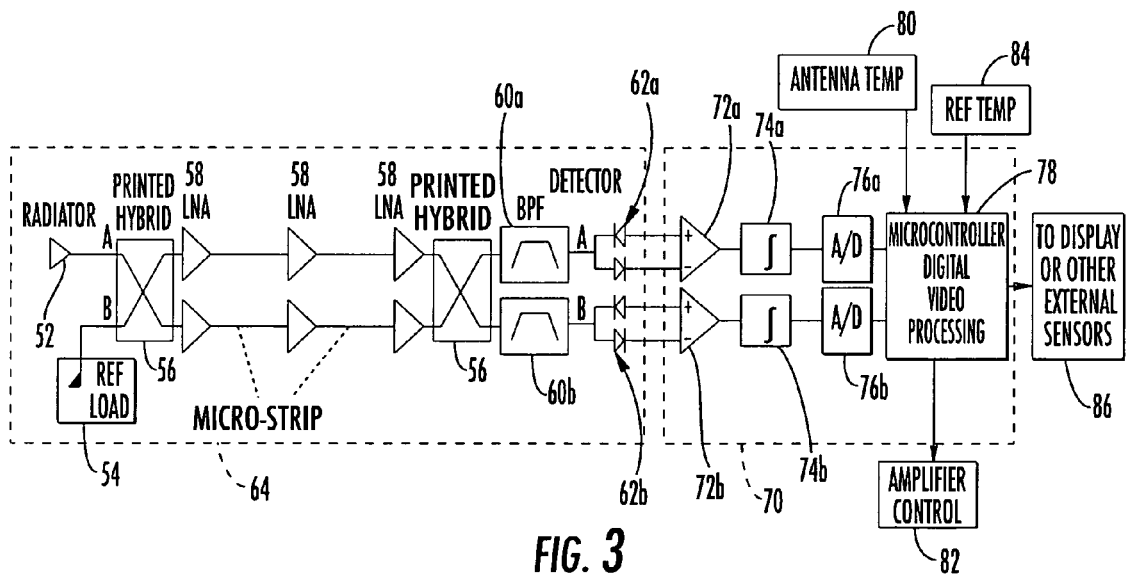
FIG. 3 is a block diagram illustrating the basic functional components of the radiometer of the present invention.

FIG. 3 is a block diagram of the radiometer 50 of the present invention. This radiometer design does not use a Dicke switch, yet it still delivers superior sensitivity and can be readily manufactured.

A radiator 52 provides a first signal input A while a reference 54 provides a second signal input B. The radiator 52 could be many types of radiator elements used in radiometers, including an antenna. Microstrip quadrature hybrid circuits 56 are operable with low noise amplifier circuits 58. The hybrid circuits can be 90° hybrids. Bandpass filter circuits 60a, 60b receive the signals represented at A and B, which are output to detector circuits 62a, 62b. These components are typically mounted on an RF board indicated by the dashed lines at 64. The RF board is typically formed from a single soft board or ceramic material. All MMW microstrip circuits, for example, 50 ohm lines, filters, hybrids and RF radiators, are printed on this board. Any MMIC amplifiers can be attached directly to the board, or through cut-outs, on a carrier plate underneath to the RF board.

The signals (A and B) are output to a controller board indicated by dashed lines at 70. On this board, any necessary video signal amplification, digitization and conditioning, automatic RF amplifier bias adjustment, and DC power regulation occurs. This board can interface directly with a video display system. The signal is received at two chopper amplifier circuits 72a, 72b. After amplification, the signals are integrated at integrator circuits 74a, 74b, and digitized at analog/digital (A/D) circuits 76a, 76b. A microcontroller circuit 78 provides digital video processing and receives an antenna temperature signal 80, amplifier control signal 82, and reference temperature signal 84. The output from the microcontroller circuit 78 is sent to a display or other external sensors 86.

The radiometer 50 uses microstrip quadrature hybrids 56 to distribute the signal and reference powers to the balanced amplifier chain as illustrated. The pairs of low noise amplifiers (LNA's) 58 are cross-coupled to each other, similar to a conventional balanced amplifier configuration.

Figure 3A:
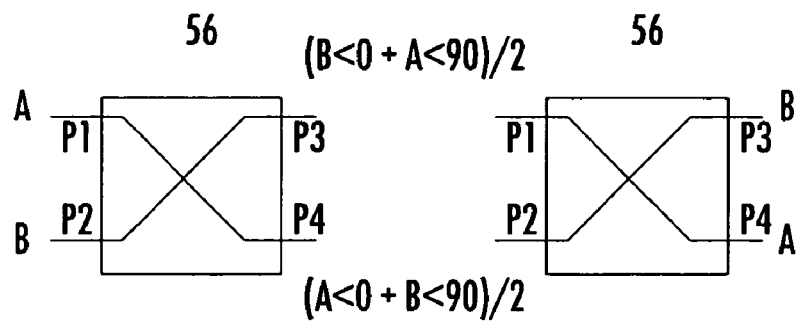
FIG. 3A is a block diagram of the quadrature hybrid used in the radiometer of FIG. 3 showing how inputs A, B are divided equally in the first hybrid, then reconstructed in the second hybrid.

The quadrature hybrid shown in FIG. 3A is a well known four-port device that splits the energy into equal parts at the output, but with a 90 degree phase difference. For example, the signal A at the input port P1 of the hybrid is divided up to two parts at the output ports P3 and P4. The same is true for the input signal B at the input port P2 of the hybrid, which is also divided equally at the output ports P3 and P4. When the output of the first hybrid is used as input into a second hybrid, the signals A and B are restored at the output of the second hybrid (of course with some losses due to the hybrids). The two inputs A and B, which can represent the antenna port and the reference port, or represent two antenna ports representing two different polarizations, are divided equally among the amplifiers and reconstructed at the output, as shown in FIG. 3A. One other unique feature of this hybrid design is that failure of one or more of the LNA's 58 in the chain does not result in failure of the channel itself. Because of the distributed gain approach, the gain of the channel will drop by a small amount, which can be accounted for in the microcontroller 78. This is different from the traditional radiometer shown in FIG. 2, where failure of one LNA will result in total failure of the element.

Because each signal passes through each amplifier in the chain, any fluctuation in the gain of any of the amplifiers is applied equally to both signals ($T_A$ & $T_{Ref}$). Assuming that the hybrid circuits 56 are well balanced by using good design practices, this radiometer design guarantees that the gain in each channel is substantially the same. In addition, because the gain in each channel is essentially the average of that of all the amplifiers in the chain, the overall gain fluctuation is effectively reduced by a factor of the square root of N, where N is the number of amplifiers.

$$\Delta G_{sys} = \left[(1/N)\sum_{i=1}^{N}(\Delta G_i)^2\right]^{1/2}$$

Assuming the same amount of the LNA's gain variation (+/−3 dB) used for the Dicke radiometer as shown in FIG. 2, the radiometer system gain variation of the present invention will be only about +/−0.7 dB. Therefore, it is evident that the radiometer of the present invention provides the inherent benefits of receiver gain fluctuation reduction and guarantees equal gain for both the antenna power and the reference signal. This feature provides the same benefit as the Dicke switch without the added losses and the complex switching circuitry. Also, the absence the Dicke switch in the present invention allows continuous observation of the antenna temperature, thereby achieving the sensitivity of a total power radiometer.

$$\Delta T_{ideal} = (1/\sqrt{B\tau})T_{sys}$$

Using commercially available W-band LNA's with over 20 GHz bandwidth, such as an ALH394 circuit made by Velocium of Redondo Beach, Calif., and assuming an integration time of 20 msec and 1200 K total system temperature, this radiometer sensitivity is less than 0.1 degree. The ALH394 is a broadband, three-stage, low noise monolithic HEMT amplifier. It has a small die size and is passivated. Bond pad and backside metallization can be Ti/Au and compatible with conventional die attach, thermocompression and thermosonic wire bonding assembly. It can have a usable radio frequency of 76 to about 96 GHz, linear gain of about 17 dB, and a noise FIG. of about 5 dB depending on applications. It can use DC power of about 2 volts at 34 mA. Bond pads can include VG1, VG2 and VG3, VD1, VD2, VD3, with an RF in and RF out pad.

The RF signals at the output of the band pass filter 60a, 60b are detected using the square law detector 62a, 62b. In order to eliminate any detector variation over temperature, a pair of balanced diodes 62a, 62b, such as a DBES105a diode manufactured by United Monolithic Semiconductors, can be used. This dual Schottky diode is based on a low cost 1 µm stepper process with bump technology and reduced parasitic conductances and having a high operating frequency. It can be a flip-chip dual diode with high cut-off frequencies of about 3 THz and a breakdown voltage of less than −5 volts at 20 uA. It has a substantially adequate ideality factor of about 1.2.

The diodes output an equal amount of power, but with opposite polarity. This method effectively cancels any bias or drift caused by the diodes. The very small DC voltages at the output of the diodes are typically very difficult to amplify accurately. DC offsets introduced by the op-amps are usually a cause of the problem, aggravated often by low frequency noise (l/f). The radiometer 50 of the present invention uses chopping op-amp circuits 72a, 72b, also known as auto zero amplifiers, such as the AD8628 amplifier manufactured by Analog Devices. This amplifier circuit eliminates DC offset and low frequency (l/f) noise.

The AD8628 amplifier has ultra-low offset, drift and bias current. It is a wide bandwidth auto-zero amplifier featuring rail-to-rail input and output swings and low noise. Operation is specified from 2.7 to 5 volts single supply (1.35V to 2.5V dual supply). It has low cost with high accuracy and low noise and external capacitors are not required. It reduces the digital switching noise found in most chopper stabilized amplifiers, and has an offset voltage of 1 µV, a drift less than 0.005 µV/° C., and noise of 0.5 uV P-P (0 Hz to 10 Hz). This amplifier is available in a tiny SOT23 and 8-pin narrow SOIC plastic packages.

An offset voltage of less than 1 µV allows this amplifier to be configured for high gains without risk of excessive output voltage errors. The small temperature drift of 2 nV/° C. ensures a minimum of offset voltage error over its entire temperature range of −40° C. to +125° C. It has high precision through auto-zeroing and chopping. This amplifier uses both auto-zeroing and chopping in a ping-pong arrangement to obtain lower low frequency noise and lower energy at the chopping and auto-zeroing frequencies. This maximizes the signal-to-noise radio (SNR) without additional filtering. The clock frequency of 15 kHz simplifies filter requirements for a wide, useful, noise-free bandwidth. The amplifier is preferably packaged in a 5-lead TSOT-23 package.

l/f noise, also known as pink noise, is a major contributor of errors in decoupled measurements. This l/f noise error term can be in the range of several µV or more, and when amplified with the closed-loop gain of the circuit, can show up as a large output offset. l/f noise is eliminated internally. l/f noise appears as a slowly varying offset to inputs. Auto-zeroing corrects any DC or low frequency offset, thus the l/f noise component is essentially removed leaving the amplifier free of l/f noise.

The output of the integrator circuits 74a, 74b for both the antenna signal and the reference signals are digitized using highly linear A/D circuits 76a, 76b and are sent to the microcontroller 78, where the reference signal is subtracted from the antenna signal to obtain the actual target temperature. The microcontroller 78 can monitor the temperature of the antenna through a sensor attached to the antenna. Any differences between the antenna and the reference are accounted for and corrections are applied appropriately in software. The microcontroller 78 also controls the LNA bias and monitors the amount of current drawn by each amplifier and adjusts the amplifier gain.

Figure 3B:
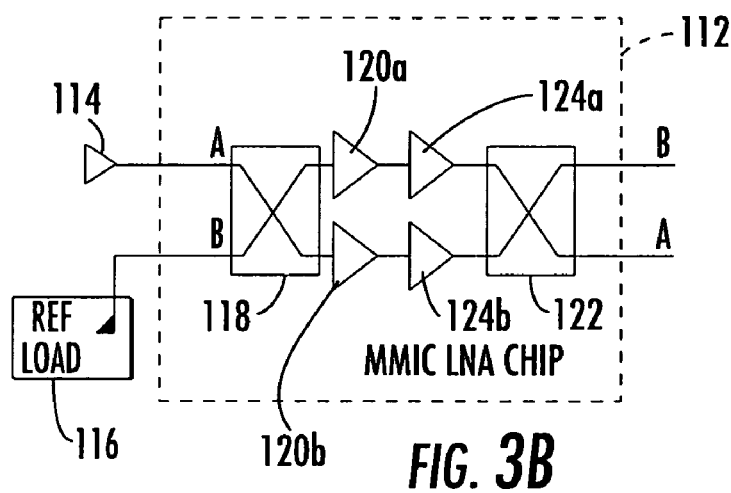
FIG. 3B is a block diagram showing a two-stage MMIC LNA chip of the present invention as a representative example.

FIG. 3B shows a two-stage MMIC chip 112 that can be used in the present invention to replace the discrete implementation of the hybrid and cascade LNA's shown in FIG. 3. This MMIC LNA chip receives a signal from the antenna 114 or reference load 116 that enters through signal inputs A and B into the hybrid circuit 118 and into amplifiers 120a. 120b through amplifiers 124a, 124b, through hybrid 122 to be output as signals A and B amplified.

Figure 3C:
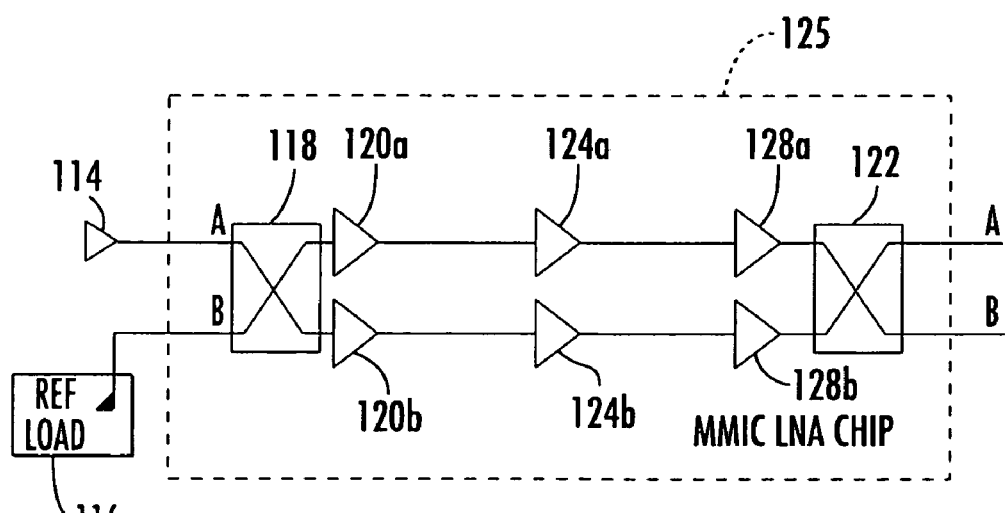
FIG. 3C is a block diagram showing a three-stage MMIC LNA chip of the present invention.

FIG. 3C is a block diagram showing a three-stage MMIC LNA chip implementation 125 with respective amplifier circuits 128a and 128b.

Thus, the balanced channel approach of the present invention can use MMIC chips and the implementation of a radiometer channel can occur either by the use of a single millimeter wave monolithic integrated circuit (MMIC) or through discrete implementation using printed hybrids and multiple MMIC LNA's.

Figure 3D:
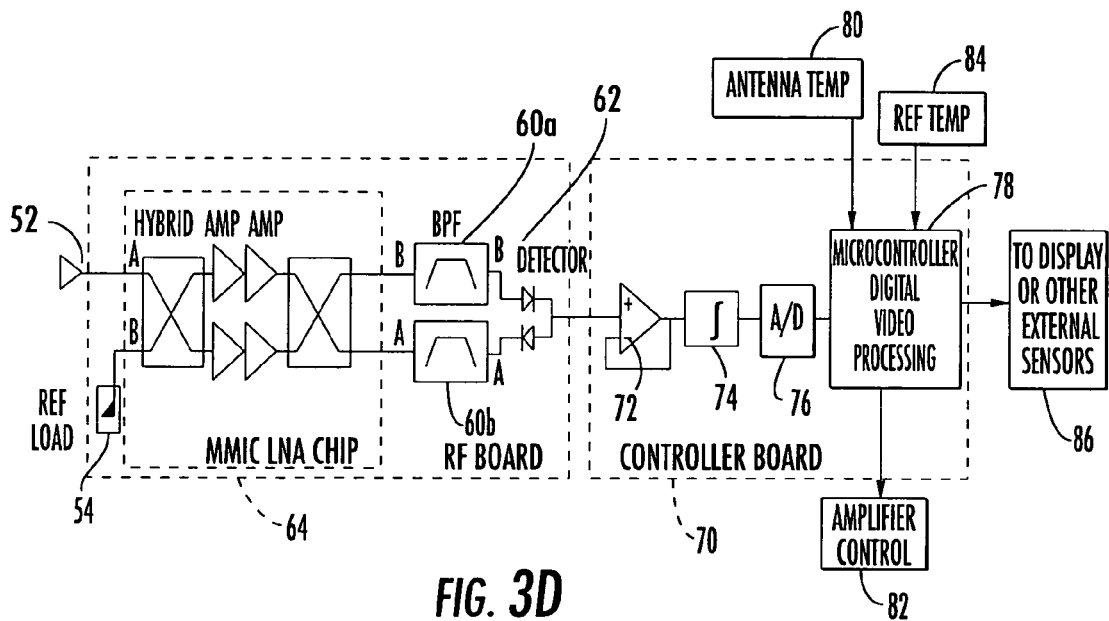
FIG. 3D is a block diagram illustrating the basic functional components of the radiometer of the present invention using the MMIC chip of FIG. 3B.

FIG. 3D is a block diagram of the radiometer 50 of the present invention. This radiometer design uses the MMIC chip 112 shown in FIG. 3B to replace the printed hybrids and individual LNA chips. This figure shows yet another example of how the radiometer channels can be designed. Only one detector 62 as a pair of diodes is used, and a chopper 72 amplifier, integrator 74 and A/D circuit 76.

Figure 4:
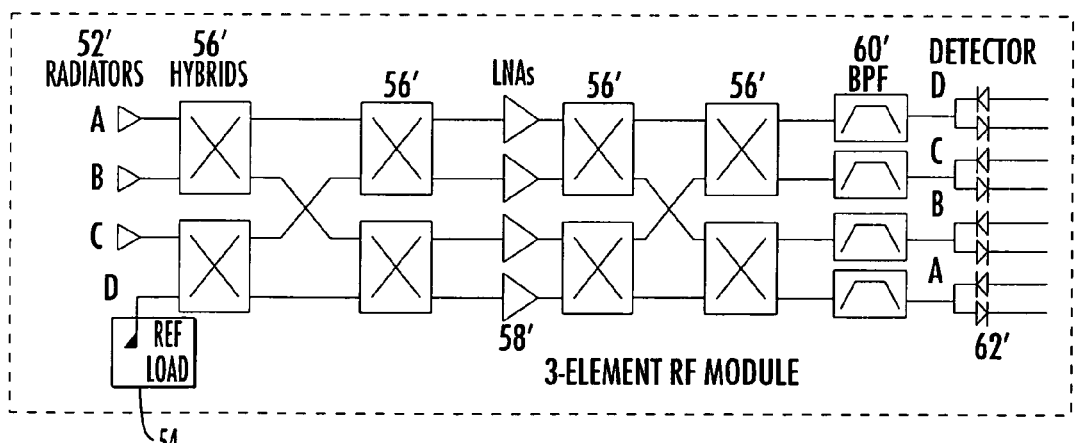
FIG. 4 is a block diagram showing functional components of another example of a multi-channel radiometer of the present invention.

The radiometer of the present invention can also be manufactured in an arrangement having a larger number of channels, such as shown in FIG. 4. Prime notation is used to show the various radiators 52', hybrid circuits 56', and low noise amplifiers 58'. As illustrated, signals A, B and C are generated from radiators 52' and a reference signal is generated from the reference 54'. Two parallel hybrid circuits 56' are illustrated at the front end and input into four parallel, low noise amplifier circuits 58' instead of two as shown in FIG. 3. This follows by other parallel hybrid circuits 56' and low noise amplifier circuits 58'. Four bandpass filters 60' are illustrated with detector circuit 62' forming a three-element radio frequency module.

Figure 5:
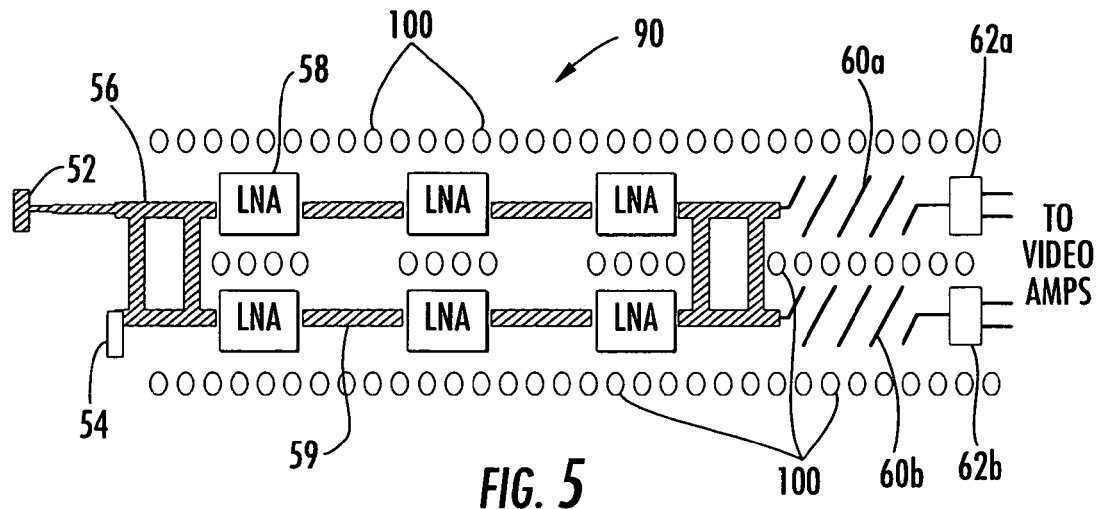
FIG. 5 is a block diagram showing the layout for the RF front end in the radiometer of the present invention.

FIG. 5 shows an example of a layout for the RF front end used in the radiometer 50 of the present invention, forming a radiometer cell 90. The radiator elements 52, the quadrature hybrids 56, 50 ohm microstrip lines 59 and the filters 60a, 60b are all printed on a soft board or a ceramic board. Isolation vias 100 are used to isolate the amplifiers 58 and reduces the likelihood of oscillations.

Figure 6:
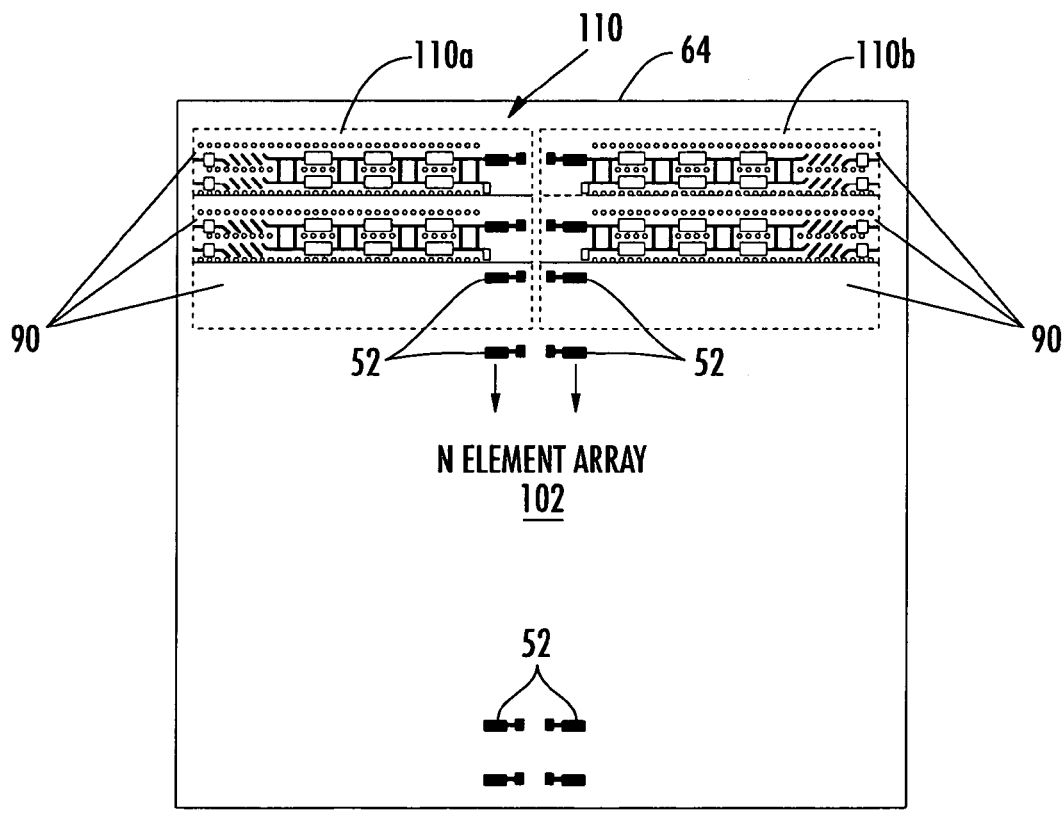
FIG. 6 is a plan view showing a multi-channel radiometer layout on a single RF board.

FIG. 6 shows a multi-channel radiometer layout on a single RF board. Pluralities of radiometer cells 90 are illustrated, forming an N element array 102 with channels 110. Radiators 52 are also illustrated. This design approach allows for low cost implementation of a large number of channels. The radiator elements 52 can be spaced half a wavelength (λ/2) apart for lower cross coupling, lower sidelobes and overall improved operations. The channels 110 are stacked on both sides of the board in order to achieve two rows 110a, 110b of radiometer cells 90 in a very small amount of space. For dual polarization applications, one row 110a may be vertically polarized while the second row 110b could be horizontally polarized. The radiators, for example, as antenna elements, can be alternated between vertical and horizontal polarization in the same row. For example, a 32×2 array can easily fit a 3×4 inch RF board. This board can become part of a radiometer module of the present invention.

Figure 7:
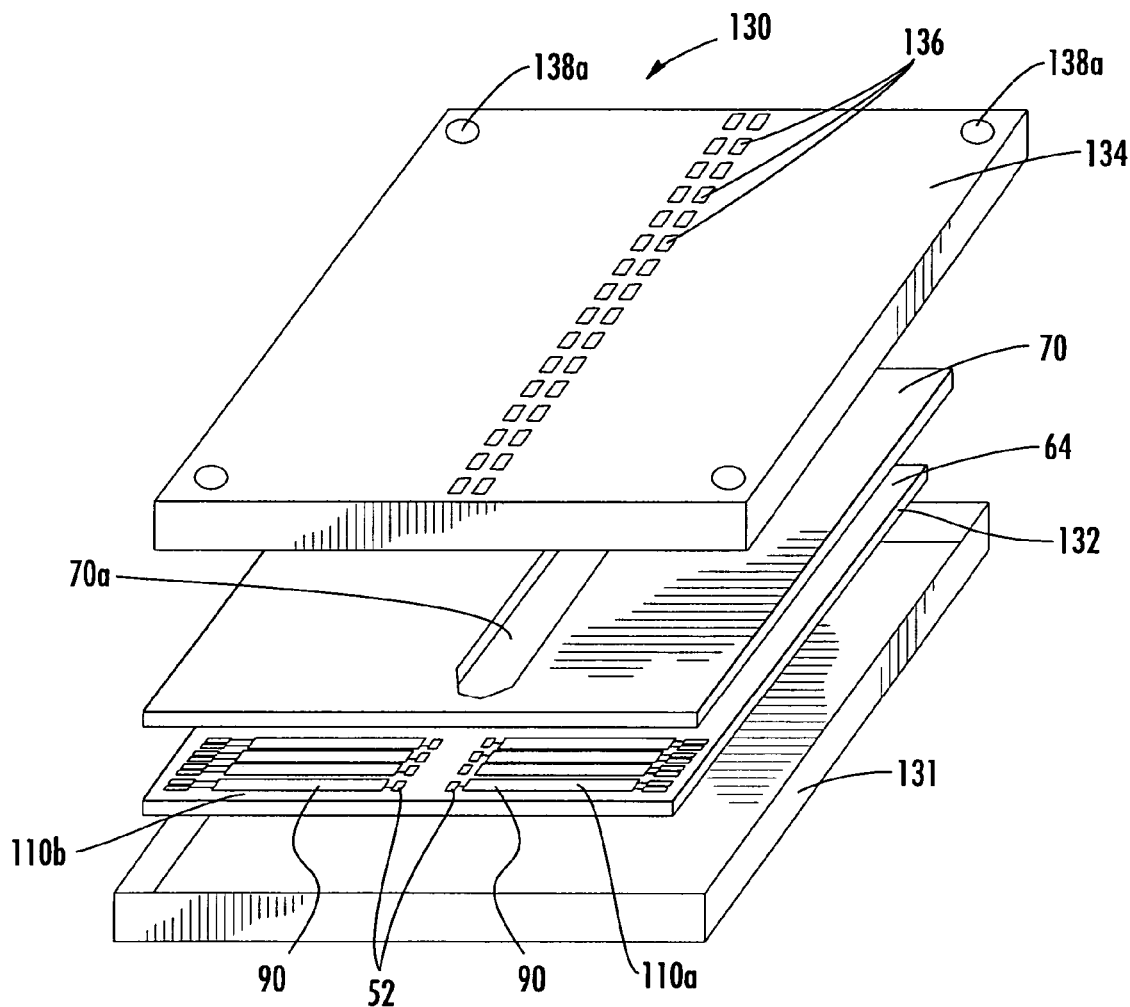
FIG. 7 is an exploded isometric view of a compact multi-channel radiometer module showing a base housing, RF board, controller board and top cover.

FIG. 7 shows an exploded view of a compact, multi-channel radiometer module 130. A base housing 131, typically made-up of aluminum, is used to receive the RF board 64, which can be attached to a CTE matched carrier 132. The controller board 70, which supplies all the DC voltages and control signals, makes contact with the RF board 64 through the use of DC contact connectors. The top cover 134, which can be made from a plastic material, is metallized everywhere except where the radiator areas 136 correspond to the location of the radiators. These unmetallized radiator areas 136 provide a dielectric media for the RF energy to travel through. Thus, RF launch openings are formed. A slot 70a in the controller board provides access to the antenna elements. The entire unit is assembled using fasteners, such as screws received in fastener apertures 138a.

Figure 8:
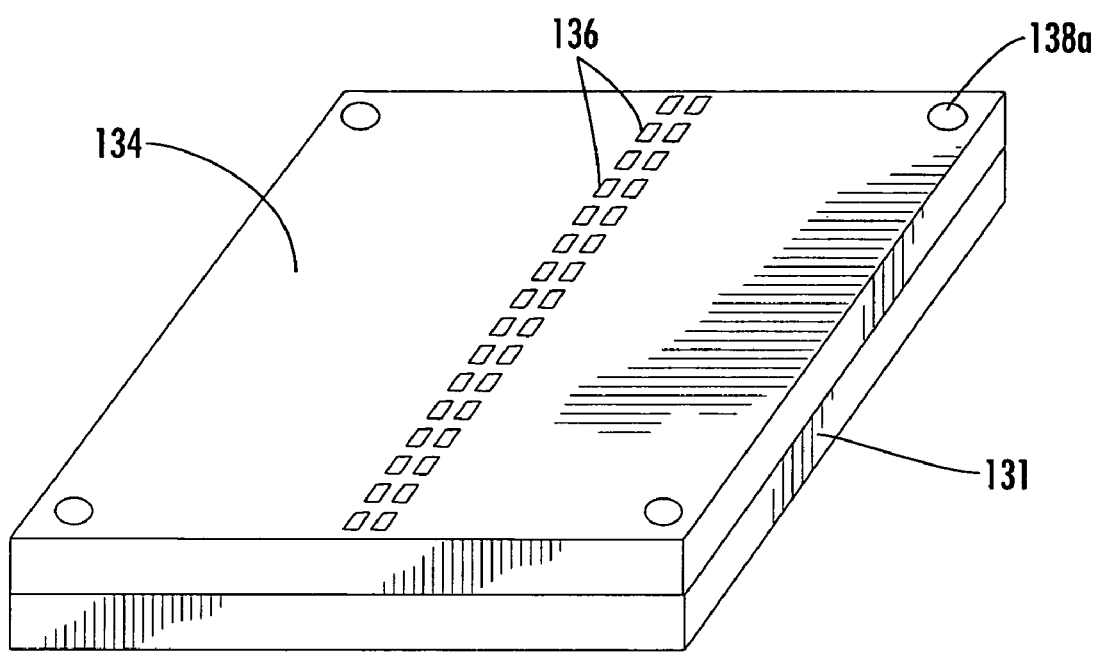
FIG. 8 is an isometric view of the assembled multi-channel radiometer module of the present invention.

FIG. 8 shows fully assembled multi-channel radiometer module of the present invention forming a radiometer module or "sensor package" as illustrated.

Figure 9:
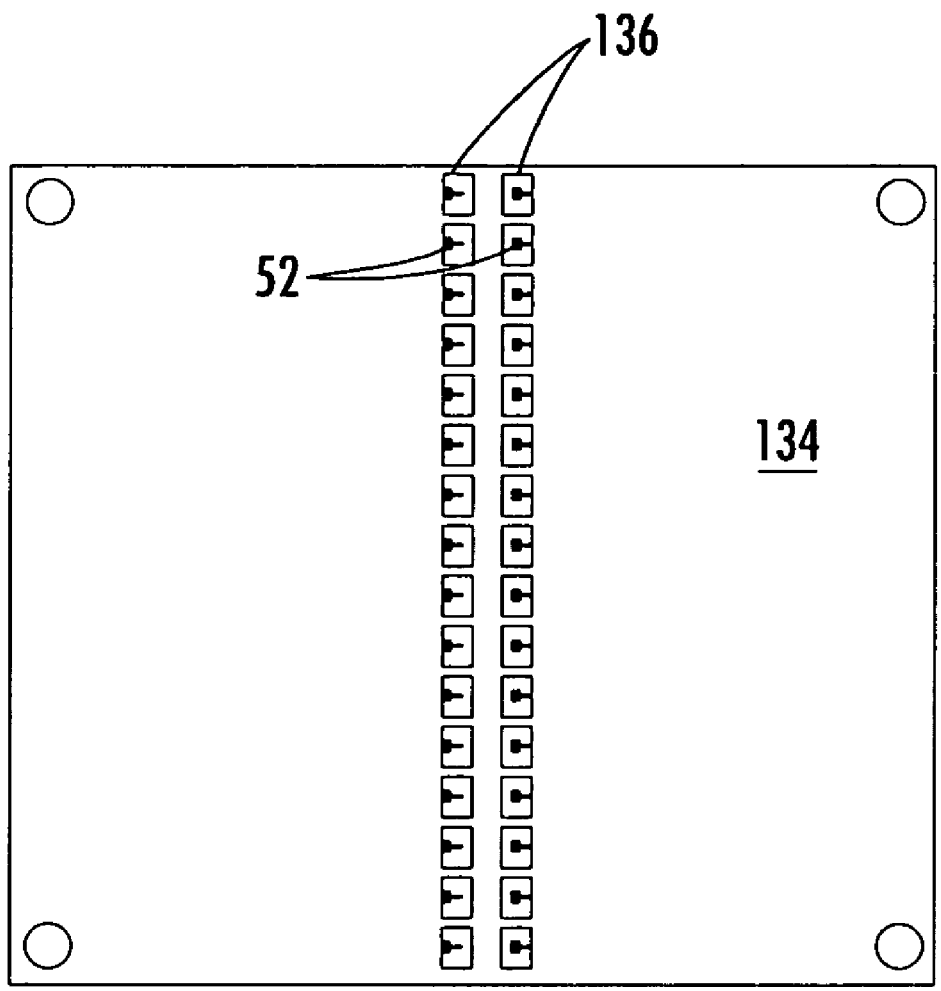
FIG. 9 is a top plan view of the multi-channel millimeter wave radiometer module shown in FIG. 8.

FIG. 9 is a top plan view of the multi-channel millimeter wave radiometer module shown in FIG. 8 and showing the radiator areas 136 and radiators. FIGS. 10 and 11 show various components of a Dicke radiometer (FIG. 10) and showing the Dicke radiometer sensitivity as compared to the radiometer sensitivity of the present invention as shown in FIG. 11. The different components of the radiometers and the relative sensitivity and operating or reference values are shown under the specific elements as illustrated.

The radiometer module of the present invention has at least six times higher sensitivity than more current radiometer sensitivity, such as the Dicke radiometer sensitivity explained above with reference to FIG. 2 and shown in FIG. 10. The radiometer, in accordance with one non-limiting example of the present invention, is advantageous and provides a radiometer with the sensitivity of less than 1°K. The radiometer module (sensor) is at least ten times smaller than many typical radiometers currently in use. The radiometer of the present invention also is at least ten times lighter in weight than many other radiometers in existence, which typically weigh no less than 20 pounds. The radiometer of the present invention is typically less than about three pounds.

The radiometer, in accordance with one non-limiting example of the present invention, also is self-correcting for temperature and gain variations. It can use a balanced pair of diodes for detection and chopper operational amplifiers to eliminate any bias and reduce l/f noise. The microcontroller can monitor temperature changes between the antenna and the reference by reading any temperature sensors located on the antenna and near the reference. This can be based on temperatures to adjust for a correction factor. The gain can be continuously monitored and the bias adjusted for the low noise amplifier (LNA) to maintain constant gain. Real-time corrections can be performed on all video channels to account for any changes in temperature or gain.

The radiometer of the present invention also has self-healing capability because of the distributed gain approach. Failure of one or more LNA's in each channel will not result in failure of the channel. The microcontroller can compensate for the drop of any amplifiers in the chain.

Figures 12, 13:
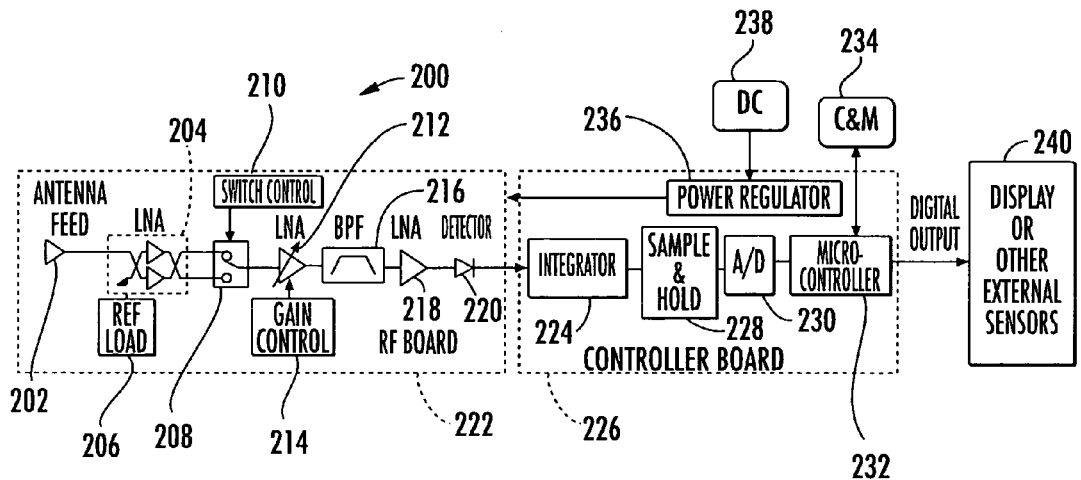
FIG. 12 is a block diagram illustrating basic functional components of the radiometer system of the present invention and showing a hybrid low noise amplifier followed by the switch.
FIG. 13 is a chart showing a Dicke radiometer system and noise performance of the different components.

FIG. 12 is a block diagram of a radiometer system 200 of the present invention using a combination of hybrid low noise amplifiers and a switch to achieve low system temperature and low implementation cost. Unlike a typical Dicke radiometer where the switch losses translate directly into an increase in system noise and system temperature, moving the switch after a first low noise amplifier circuit as illustrated in FIG. 12 nearly eliminates the impact of the switch losses. The radiometer system of the present invention combines the benefit of the low noise figure achieved by the hybrid approach and a simple, single channel processing achieved by the Dicke approach.

FIG. 12 shows an antenna feed 202 operatively connected to the low noise amplifier circuit 204, which receives antenna signal and the reference signal from the reference load 206. The low noise amplifier circuit 204 is cross-coupled and quadrature and has signal outputs received at the switch 208 that also receives a signal from a switch control 210. This circuit could be a microcontroller or other processor as part of or controlled from the controller board. The switch 208 is operatively connected to an adjustable low noise amplifier 212, which receives a gain control signal from gain control circuit 214. The output signal enters a band pass filter 216, low noise amplifier circuit 218 and detector circuit 220, all of the type that could be used as described for the embodiment shown in FIG. 3 or other embodiments as non-limiting examples. The components as described are contained on an RF board 222 shown by the dashed line.

The detected signal from the detector circuit 220 passes into an integrator circuit 224 that are positioned on the controller board 226 and into a sample and hold circuit 228. The analog signal is then converted into a digital signal by an appropriate analog/digital converter 230 and received in a microcontroller 232, which is operative with a C&M circuit 234. A power regulation circuit 236 receives DC signals from a DC source 238 and regulates the RF board 222 and controller board 226. The microcontroller 232 can output a digital signal to a display or other external sensors 240 as described before. It should be understood that the term microcontroller in this description encompasses many different types of controllers and processors.

FIGS. 13, 14 and 15 show a respective comparison of the resulting system noise performance from a traditional Dicke radiometer and the hybrid and the hybrid/switch, in accordance with one non-limiting example of the present invention. The left hand side of the chart shows the gain/loss in decibels, followed by the noise figure in decibels, the noise temperature in degrees Kelvin, the cumulative gain, the cumulative NF, and the cumulative temperature. Each of the functional blocks of the radiometer is illustrated with corresponding results listed under that corresponding functional block. For example, FIG. 13 shows the ambient temperature and the various results at the horn, the waveguide transition (WGT), the switch, the two low noise amplifiers, the band pass filter, the low noise amplifier and the detector.

FIG. 14 shows the results for the hybrid circuit described before, such as with FIG. 3, with the ambient temperature and the horn, the waveguide transition, the low noise amplifier, microstrip, low noise amplifier, band pass filter, low noise amplifier microstrip and detector.

FIG. 15 shows the results for an example of the hybrid and switch combination of the present invention, showing the ambient temperature, and the functional blocks of the horn, waveguide transition, the low noise amplifier that receives the reference signal, the switch, the microstrip, the low noise amplifier, the band pass filter, the low noise amplifier and detector circuit.

These results show the system temperature in degrees Kelvin (K) for the three configurations corresponding to the Dicke, hybrid and hybrid/switch. The Dicke radiometer in the example as shown in FIG. 13 results in 2129.9 degrees K system temperature. The hybrid radiometer results in 1337.2 degrees K system temperature. The hybrid/switch radiometer example of the present invention results in 1361.2 degrees K. Thus, the hybrid/switch system example of the present invention results in only a 24 degree K increase in system temperature over the hybrid approach, but benefits from the single channel process and simplicity of the Dicke radiometer.

Figure 16:
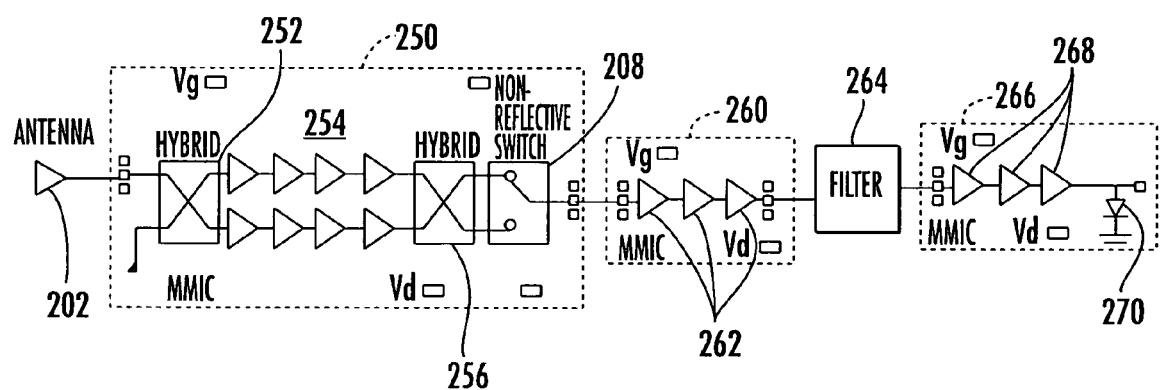
FIG. 16 is a block diagram of a hybrid/switch low noise amplifier radiometer of the present invention showing its use of MMIC chips.

FIG. 16 is another block diagram of an example of the radiometer of the present invention showing how different MMIC chips can be implemented in the combined hybrid/switch radiometer front end of the present invention. As illustrated, signals from the antenna 202 are received in the first MMIC chip 250, which includes a hybrid 252, amplifiers 254, hybrid 256 and non-reflective switch 208. A load input is shown as part of the MMIC, but could be remote from the MMIC. A second MMIC 260 chip includes amplifiers 262. This is followed by a filter 264 and a third MMIC chip 266 with appropriate amplifiers 268 and detector 270. The first MMIC chip 250 combines the hybrid LNA (approximately 20 decibel gain and less than 4 dB NF) configuration with a non-reflective switch 208 of less than about 1.5 dB. The second LNA chip 260 can be a single channel amplifier of about 16 dB gain, which provides the capability of adjusting gain by changing the gate bias (Vg). The third MMIC chip 266 combines a single channel low noise amplifier with a detector diode 270.

It is evident that the radiometer as described enhances performance and reduces complexity. The radiometer includes the benefits of the hybrid radiometer performance with the simplicity of single channel processing provided in the Dicke radiometer. A MMIC chip implementation is provided that simplifies the RF front-end implementation in one non-limiting example, although MMIC chips for other radiometer configurations can be used. One MMIC chip example combines the LNA hybrid function and a non-reflective switch. A second LNA is a simple single channel amplifier. A third LNA combines the amplifier function with a zero bias detector diode to provide a low cost, high performance radiometer.

Referring now to FIGS. 17-28 there are disclosed different embodiments of Monolithic Microwave Integrated Circuit (MMIC) chips that can be used for active or passive radiometer sensors operating at frequencies between about one (1) to about five hundred (500) GHz and having a minimum operational bandwidth of about one hundred (100) MHz such as those described above. In the different embodiments as described, the MMIC chips can have one or more inputs and outputs and incorporate quadrature hybrids to equalize gain in two or more parallel gain stages as in the examples described above. MMIC chips can operate as multifunction chips and include a low noise amplifier (LNA) or series of amplifiers and a switch or a low noise amplifier and detector, or a low noise amplifier, switch and detector combination.

The MMIC chips can include amplifiers, including one or more amplifiers, for example, Field Effect Transistor (FET) stages, and balanced amplifiers with one or more amplifier stages but having a single RF input and output. The balanced amplifiers can use quadrature hybrids such as a Lange coupler, which is often used in low loss, wide bandwidth, and compact microwave applications. Some Lange couplers have an isolated port, a through port or coupler port.

The MMIC chip examples may use air bridges to route signals above surface traces. A MMIC amplifier can also have one or more gate bias voltage pads to provide a biasing voltage to the FET gates. A MMIC amplifier can have one or more drain voltage pads to provide drain current to FET stages, which can be made of different materials such as silicone, Gallium Arsenide (GaAs) or Indium Phosphate. The MMIC chip thickness can range from a little as one mil to about several mils, for example about four or five mils in some non-limiting examples.

Figure 17:
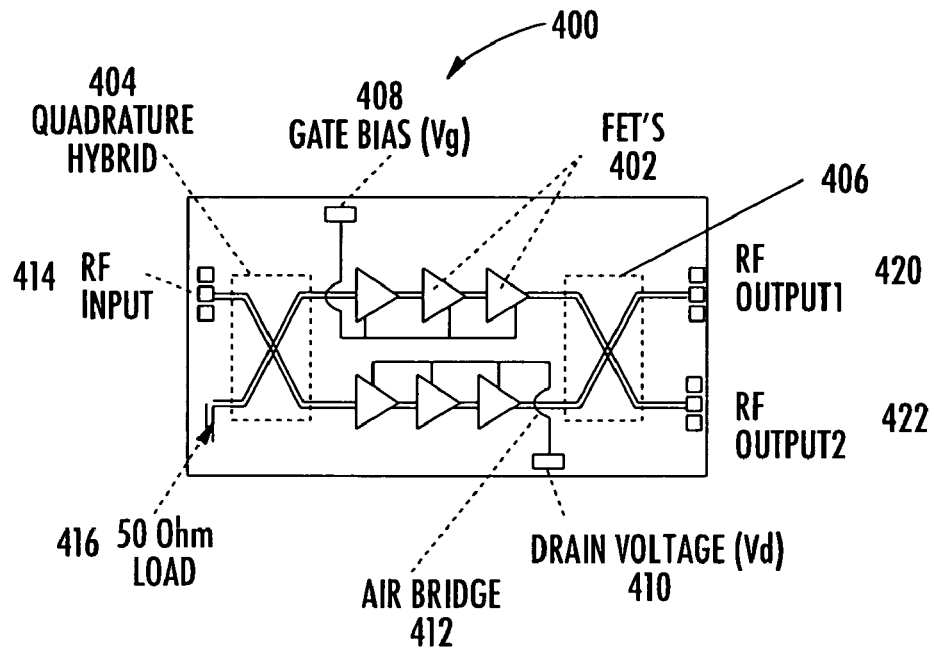
FIG. 17 is a block diagram showing a MMIC with balanced amplifier stages and a single RF input and dual RF outputs.
Figure 18:
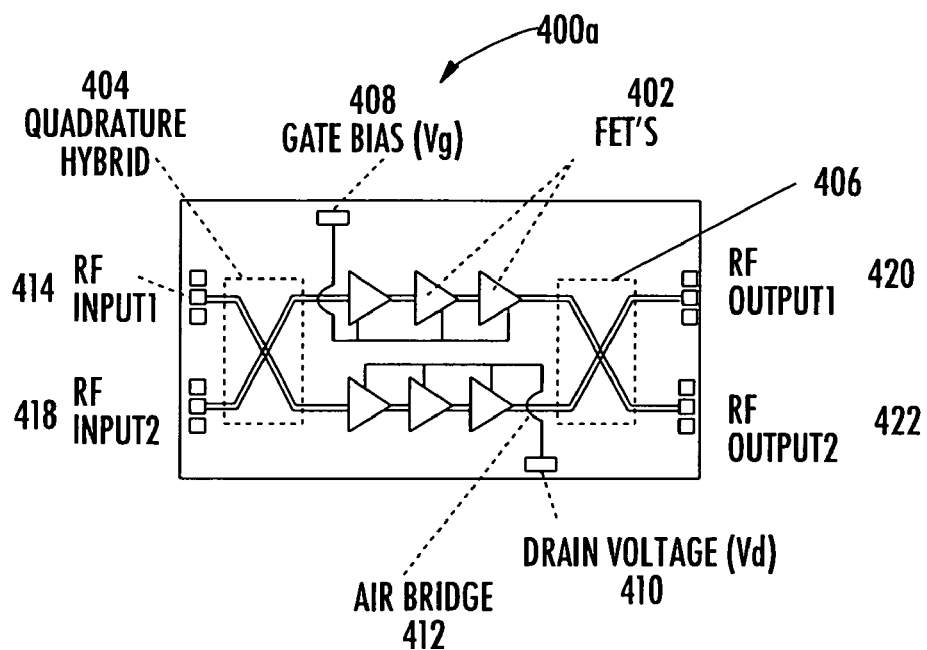
FIG. 18 is a block diagram of a MMIC similar to that shown in FIG. 17 but showing dual RF inputs.

Referring now to FIGS. 17 and 18 there are illustrated two embodiments of a MMIC chip 400, 400a in accordance with non-limiting examples of the present invention, in which balanced amplifiers 402 are formed as field effect transistors (FET's), and include one more amplifier stages with a single (FIG. 17) or dual (FIG. 18) RF input and dual RF outputs. As illustrated in both figures, the balanced amplifier chain includes a pair of three, series-connected field effect transistor amplifiers, which are 402 configured parallel to each other in two signal paths, and input and output quadrature hybrids 404, 406 connected to the two signal paths formed by the amplifiers. Gate bias ($V_g$) is applied at a pad 408 as illustrated, and drain voltage ($V_d$) is applied at a pad 410 as illustrated. An air bridge 412 is illustrated. FIG. 17 shows a first RF input 414 and a 50-ohm load 416 as a second input, while FIG. 18 shows two RF inputs 414, 418. The load 416 is shown on the MMIC, but could be off the MMIC depending on design considerations. Typically Lange couplers are formed to guarantee equal gain for both signal paths, which are output at two RF outputs 420, 422 as illustrated.

The MMIC chips can use air bridges for signals to be passed above the surface typically formed as signal traces. A MMIC amplifier 402 can have one or more gate bias voltages to provide the biasing voltage to FET gates as illustrated. One or more drain voltage pads 410 can provide drain current to the amplifier stages as illustrated. Each MMIC chip can be made of different materials as described before such as Gallium Arsenide or Indium Phosphate. The chip thickness can vary from about one mil to about several mils, and in one non-limiting example, is about 4 or about 5 mils.

FIG. 18 shows a 4-port, low noise amplifier MMIC chip 400a with input and output quadrature hybrids 404, 406. As a representative, non-limiting example, this chip can be formed as a 90 GHz chip that could have a two-volt drain voltage. There could be some maximum separation distance between RF ports, and the gain could be about 17 decibels minimum to about 20 decibels. NF could be about 5 decibels to about 4 decibels. A frequency band could range from about 80 to about 100 GHz, in one non-limiting example. A P1 decibel could be about 5 dBm minimum and the RL could be about 10 decibel minimum. The $V_g$ and $V_d$ pads 408, 410 could be on both sides, allowing any $V_{gs}$ and $V_{ds}$ to be connected together.

Figure 19:
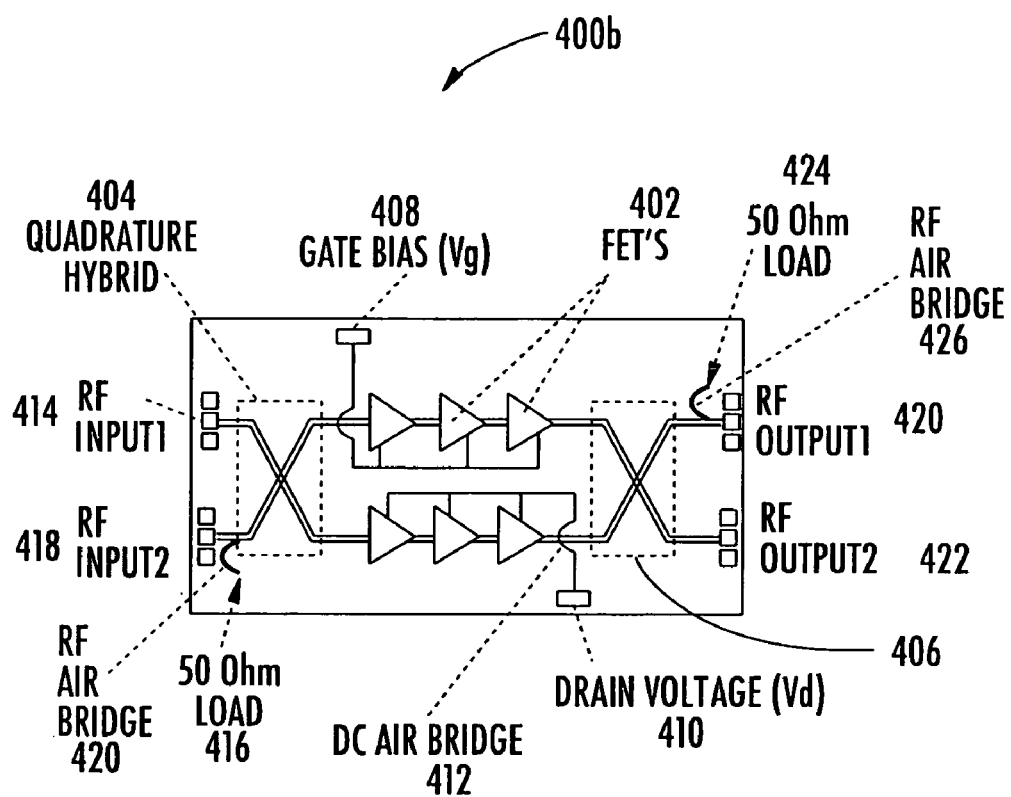
FIG. 19 is a block diagram of a MMIC similar to that shown in FIGS. 17 and 18 but showing an RF air bridge at the second RF input.

FIG. 19 is another example of a MMIC 400b that includes an RF air bridge 420 at a second RF input 418 and a 50 ohm load 416 typically as a termination resistor. The air bridge 420 could be formed as a DC air bridge and connecter to the drain voltage. A 50 ohm load 424, typically as a termination resistor, is connected to the first RF output 420 together with an RF air bridge 426. The loads 416, 424 could be formed on the MMIC or off the MMIC. This representative MMIC has balanced amplifiers 402 with one or more amplifier stages dual RF inputs 414, 418 and dual RF outputs 420, 422 with a built-in 50 Ohm load 424 and pluckable (removable) RF air bridges 426. This would allow testing of the chip 400b without requiring special equipment. Braking off the RF air bridge after testing the chip will disconnect the 50 ohm termination resistor and will transform the MMIC from a two port device such as having one input and one output to a three or four port device with one or two inputs and two outputs.

Figure 20:
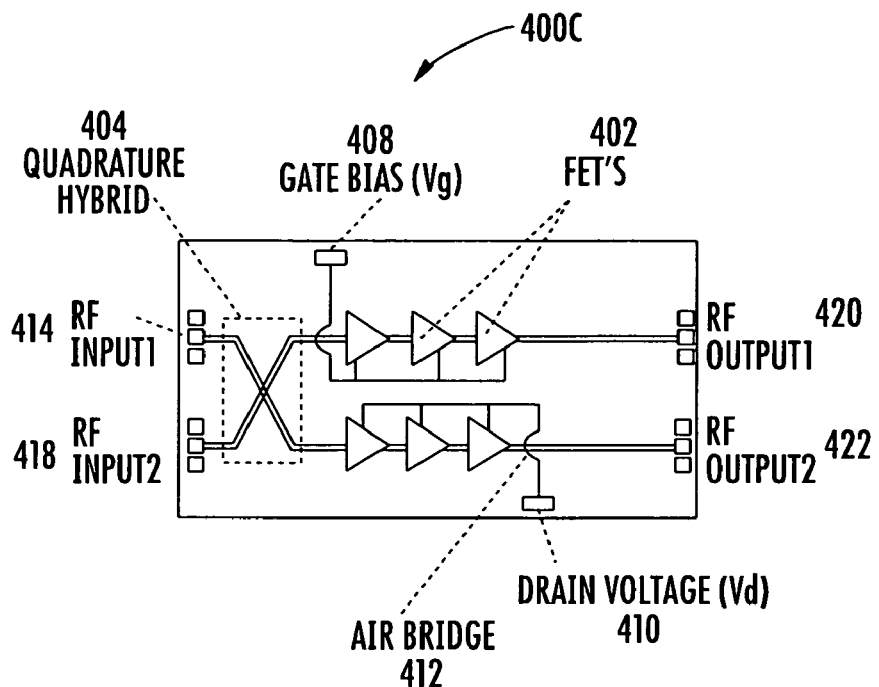
FIG. 20 is another block diagram of a MMIC similar to that shown in FIG. 18 but without a quadrature hybrid at the output.
Figure 21:
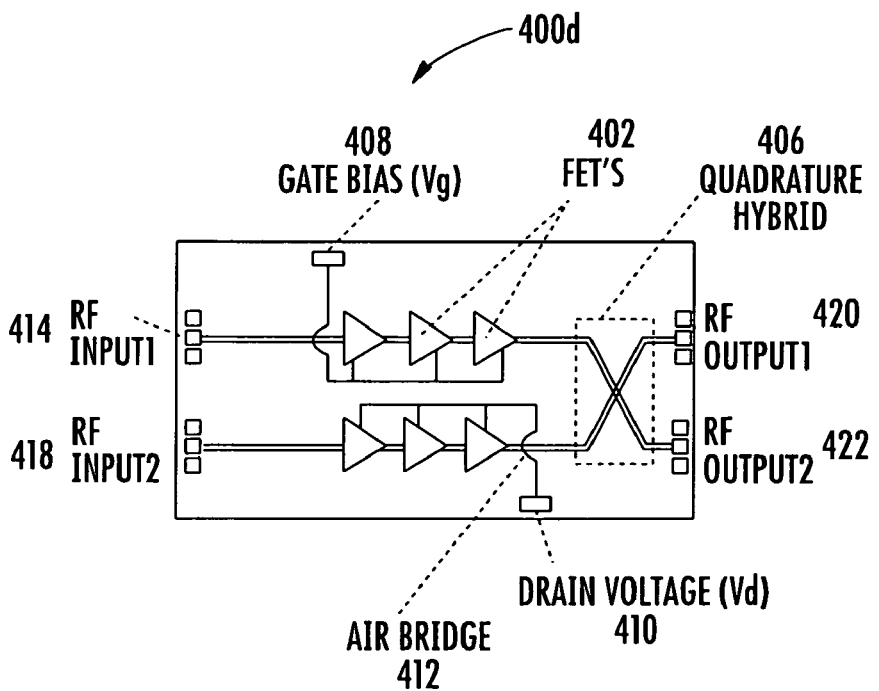
FIG. 21 is a block diagram of a MMIC similar to that shown in FIG. 20 but having a quadrature hybrid at the output instead of the input.

FIG. 20 is another example of a MMIC 400c that does not have a quadrature hybrid at the output, but includes the quadrature hybrid at the input. FIG. 21 is an example of a MMIC 400d that does not include a quadrature hybrid at the input, but includes the quadrature hybrid at the output. The chips 400c, 400d have balanced amplifiers 402 with one or more amplifier stages and can include single or dual RF inputs and dual RF outputs. The chips 400c, 400d shown in FIGS. 20 and 21 could be merged together or positioned serially together with filters or other coupling between. The balanced amplifiers 402 could use quadrature hybrids 404, 406 as a Lange coupler at the input, output, or both the input and output.

Figure 22:
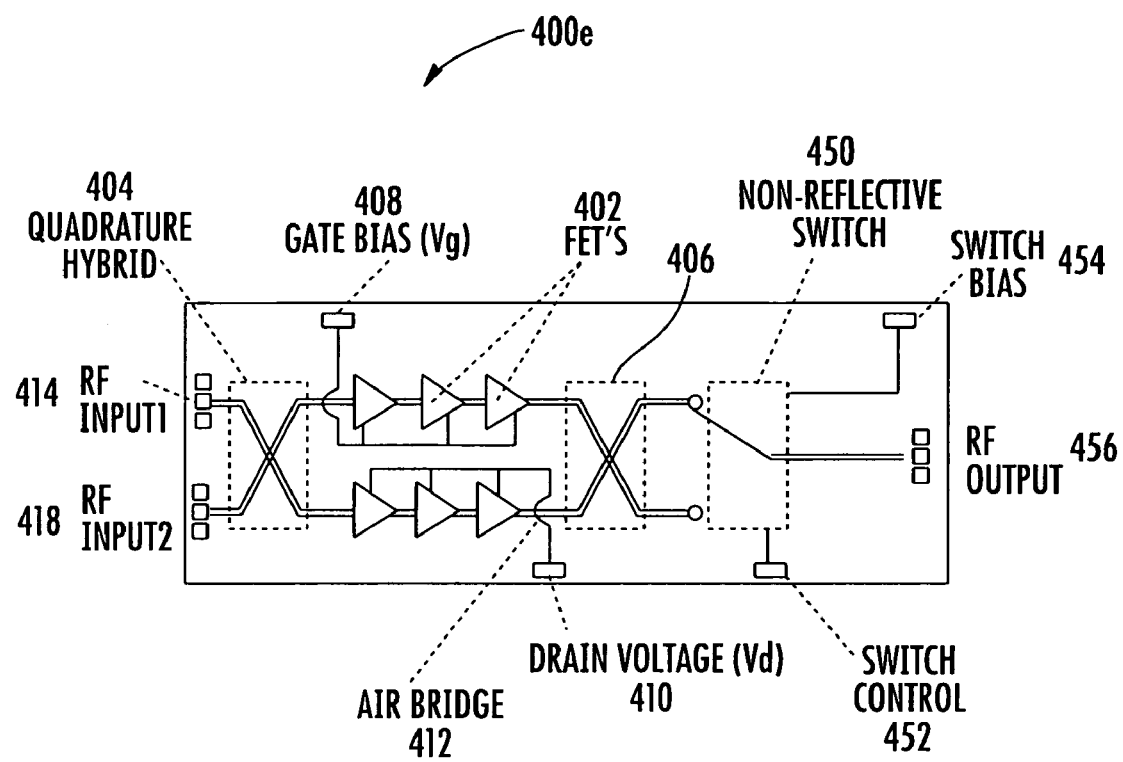
FIG. 22 is a block diagram of a MMIC similar to that shown in FIG. 18 but showing a switch connected after the quadrature hybrid at the output.

FIG. 22 is an example of another MMIC chip 400e showing the addition of a non-reflective switch 450 and a switch control pad 452 that receives control signals, and a switch bias pad 454 that receives biasing signals for biasing the switch. The microcontroller as described before can be operative for controlling these functions. A single RF output 456 is illustrated. This MMIC 400e has balanced amplifiers 402 with one or more amplifier stages. The built-in non-reflective switch 450 selects one of the RF paths. The switching is performed by varying the switch control signal through the switch control pad 452. The switch can be designed with field effect transistors or diodes. The MMIC can have dual RF inputs 414, 418 and one RF output 456. The balanced amplifiers 402 can use input and output quadrature hybrids 404, 406 as typically Lange couplers to guarantee equal gain for both signal paths. The switch 450 can be positioned at the output of the MMIC as illustrated to minimize the impact on the LNA noise figure. It is also possible to place the chip shown in FIG. 22 into a chip cascade with another chip.

An example of a type of MMIC chip specifications over different temperatures and frequencies, and an example of the MMIC chip functional ranges and switch specifications are illustrated below as non-limiting examples. Other numerical ranges and figures for the MMIC can be used as suggested by those skilled in the art.

| Parameter | Value |
| --- | --- |
| Frequency range | 80 to 100 GHz |
| Input/Output return losses | <−10 dB |
| Input/Output | 50 Ohms |
| Gain (average over bandwidth) | Sufficient gain (at 65 deg C.) to get 10 mV at detector output with a 50 K-Ohm video resistor (external) when sensing a 50 Ohm reference resistor on the first LNA. Assume 2 dB filter and interconnect losses. Recommend: 1) 52 dB minimum gain (from LNA's) at about 65 deg C. 2) Typical switch losses are about 3.5 dB 3) Typical power into the diode for 10 mV output is about −20 dBm |
| Gain variation | <1 dB over any 5 GHz from cascading all LNA's |
| 1/f Noise | Measured noise from 50 Hz to 1 MHz |
| NF (average over the bandwidth) | 3.5 dB max (at hot temperature), 4 dB (typical at room temp) for the first LNA. The second LNA NF may be degraded by about 1 dB |
| NF variation | <0.5 dB over any 5 GHz for each LNA |
| P1dB (output) | >0 dBm |
| Lange Coupler frequency | 75 to 105 GHz Note: The couplers can be made wider to accommodate multi-chip cascade |
| Lange coupler isolation | 20 dB min |
| Lange coupler phase imbalance | 5 deg max |
| Chip gain & phase balance | Chip layout of active components typically should be symmetrical |
| Drain Voltage | 1.2 Vdc |
| Drain Current | 60 mA typical |
| Vg and Vd pad size | 190 by 80 microns |

-continued

| Parameter | Value |
| --- | --- |
| Keep out area from bonding pads, crushable features, and RF Ports | 75 microns min (no crushable features) Compatible with about 100 micron pitch CPW probes (GSG). The 100 micron is typically between the steal and the ground on each side |
| Detector diode | Zero bias (Preferred), If bias current is used, no 1lf noise shall be generated by the diode above 1 KHz |
| Diode bandwidth | 80 to 100 GHz |
| Diode sensitivity (typical) | 10 mV out with 50 K Ohm video resistor for −20 dBm input |
| Temperature range | 0 to +65 deg C. |
| Physical Size | Minimize width (IA mm max) Length to width ratio not to exceed 3:1 |
| MTBF | >1 M hrs |
| Stability | Unconditional stable with 50 pf capacitor to ground close to MMIC connected to the Vd or Vg lines with a 15 mil long 1 mil diameter bond wire cascaded with a 600 pf cap to ground, 100 mils of microstrip line terminating in 0.1 uf cap to around |
| SWITCH SPECIFICATIONS | |
| Center Frequency | 90 GHz |
| Frequency | 20 GHz min |
| Bandwidth | 2.0 dB max |
| Insertion Loss | 25 dB min |
| Isolation | 12 dB min (on or off) |
| Return Loss | 15 dB (as a goal) 0 dBm min Required at all MMW ports |
| MMW Power handling On-chip | Required for all DC inputs |
| DC block | 50 nS min |
| On-chip bias decoupling | −3, 3 V +/−0.1 available or 0 V +1/−0.1 available |
| Switching time | O mA min |
| Control Voltage | 5 mA max |
| Control Current Symmetry | I/Os need to be symmetrical Compatible with 100 micron pitch CPW probes |
| RF Ports | |

Figure 23:
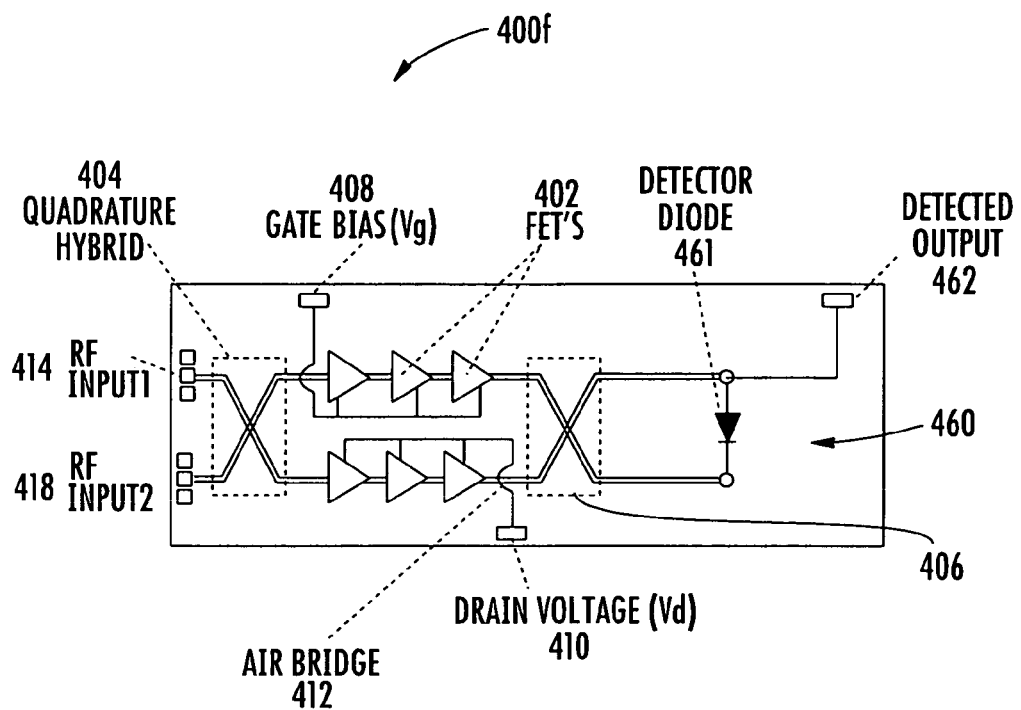
FIG. 23 is a block diagram of a MMIC similar to that shown in FIG. 18 but showing a detector positioned at the output and connected to the output quadrature hybrid.
Figure 24:
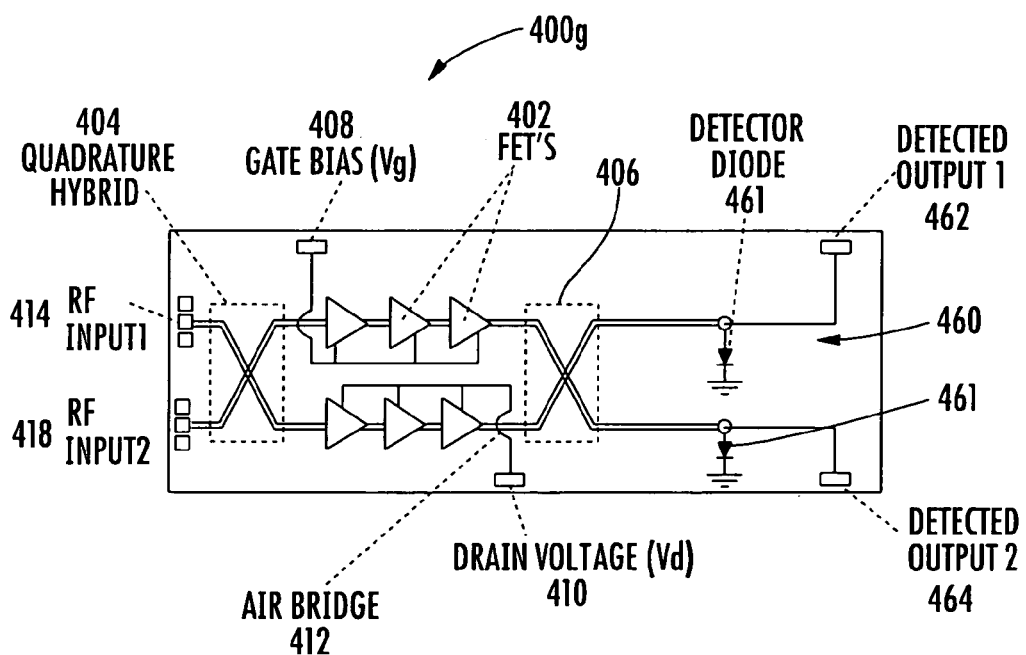
FIG. 24 is a block diagram of a MMIC similar to that shown in FIG. 23 but showing dual detector diodes and dual detected outputs.

FIGS. 23-24 show examples of MMIC's that include a detector circuit 460 formed in one non-limiting example as one or more diodes 461. As shown in FIG. 23, the output quadrature hybrid 406, includes a single detected output 462 and a detector diode 461 is positioned across the two outputs at the output quadrature hybrid 406. FIG. 24 shows a MMIC 400g having each output at its output quadrature hybrid 406 incorporating a detector diode 461 to form two detected outputs 462,464, i.e., a first detector output 462 and a second detector output 464. In these examples of MMIC's that can be used in radiometers as described above, the balanced amplifiers 402 can have one or more amplifier stages, with one or more built-in detector diodes 461 to sense the RF energy. The detector diodes 461 may be self-biased or require biasing depending on design requirements and other factors. The MMIC chips with dual or single detected RF diodes as illustrated, and the RF balanced amplifiers, can use quadrature hybrids as typically Lange couplers to guaranty equal gain for both signal paths.

Figure 25:
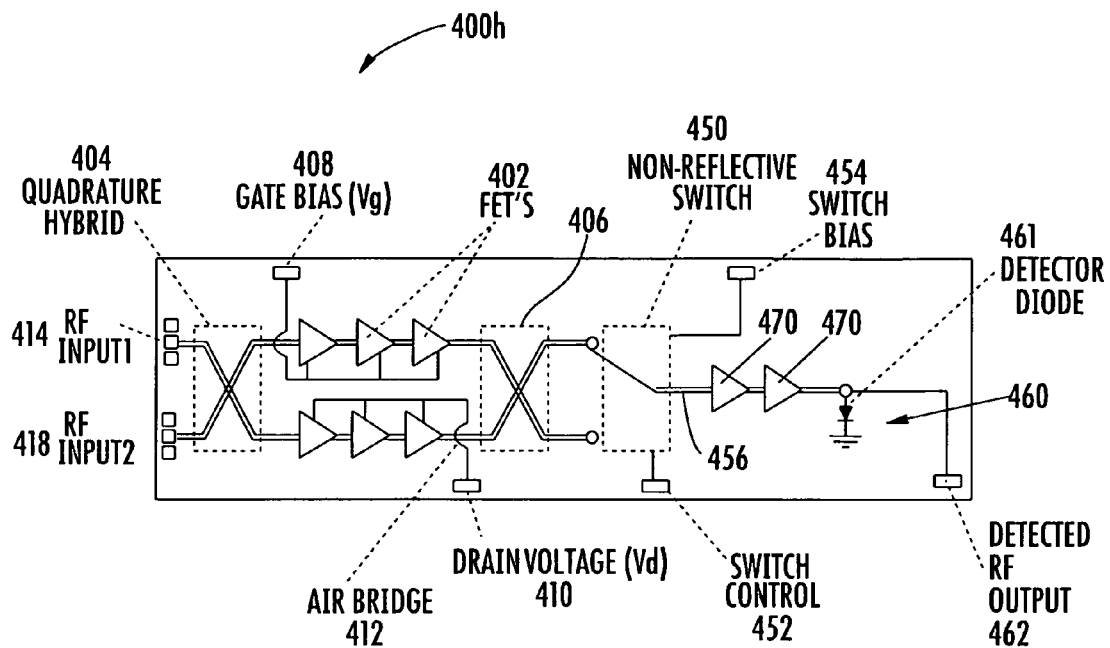
FIG. 25 is a block diagram of a MMIC similar to that shown in FIG. 22 and showing amplifiers and a detector diode connected to an output switch.

FIG. 25 is another embodiment of a MMIC 400h that includes the output quadrature hybrid 406 connected into a non-reflective switch 450 and the switch control 452 and switch biases 454 as described before. A single RF output 456 is connected to dual series connected 470 amplifiers, having an output with a detector diode 461 to form a detected RF output 462. This MMIC 400h can have balanced amplifiers 402 with one or more amplifier stages and a built-in, non-reflective switch 450 to select one of the RF paths with the built-in RF detector. The detector circuit 460 could be formed by one or more diodes as illustrated in the various embodiments. To improve the output of detector diode 461, one or more amplifier stages can be used to amplify the RF signals after the switch. The detector diode 461 could be self-biased or require biasing. The balanced amplifiers typically use quadrature hybrids 404, 406 such as a Lange coupler to guaranty equal gain for both signal paths. The switch 450 can be positioned at the output to minimize the impact on the LNA noise figure.

Figure 26:
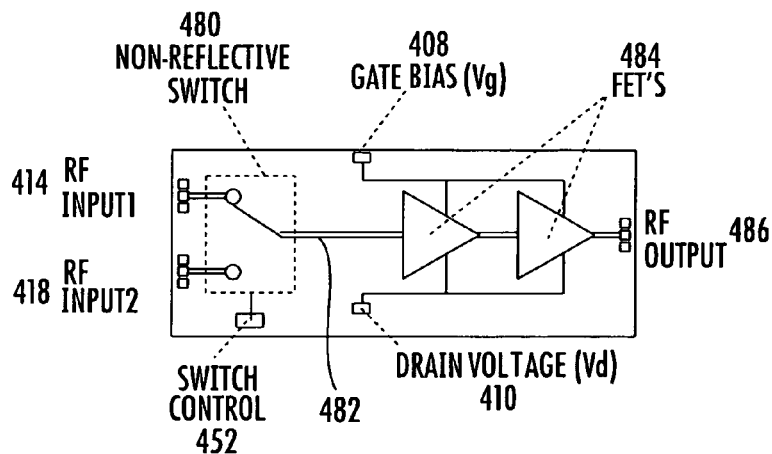
FIG. 26 is a block diagram of a MMIC showing dual RF inputs connected into a switch.
Figure 27:
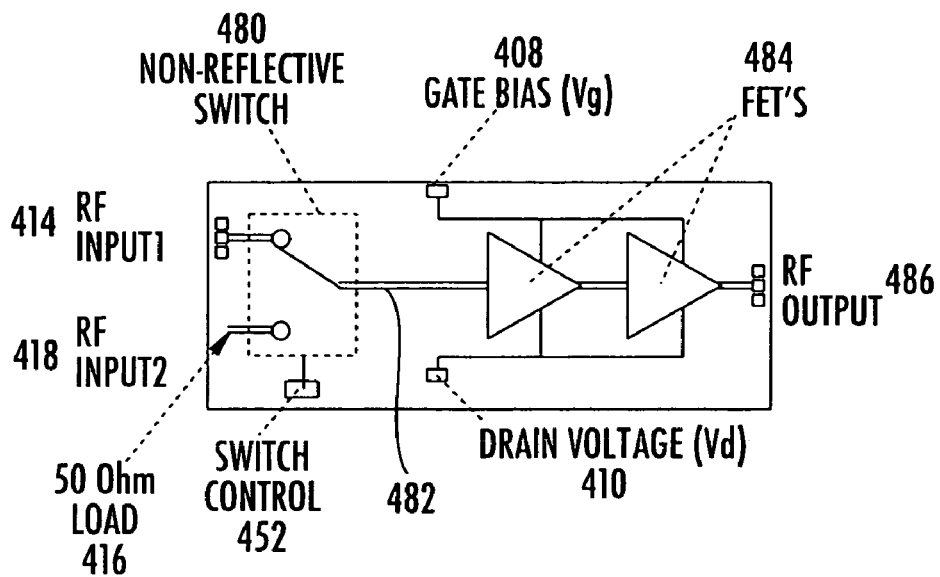
FIG. 27 is another block diagram of a MMIC similar to that shown in FIG. 26 and showing a dual input terminated in a 50-ohm load.
Figure 28:
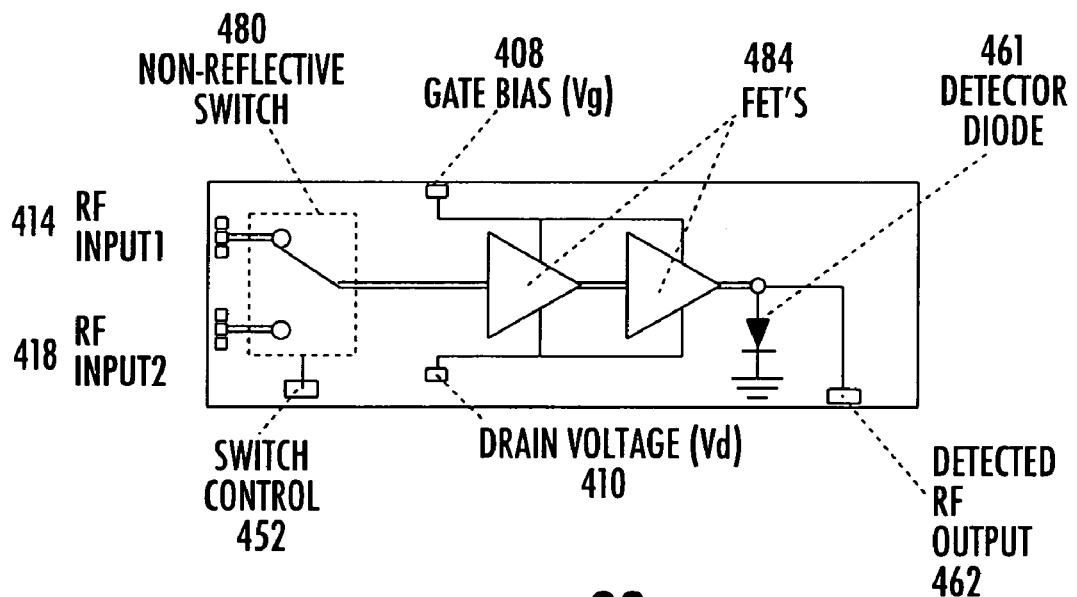
FIG. 28 is another block diagram of a MMIC showing a dual input amplifier with built-in switch and a detector diode.

FIGS. 26-28 show different embodiments of MMIC chips 400i, 400j, 400k that include dual RF inputs 414, 416 into a non-reflective switch 480, and having a single output 482 into series connected amplifiers 484 formed as field effect transistors. In FIG. 26, these amplifiers have a single RF output 486. Similar gate bias ($V_g$) and drain voltage ($V_d$) pads 408, 410 as described before can be used. FIG. 26 shows two RF inputs 414, 416, and FIG. 27 shows two RF inputs, with the second RF input 416 including a 50 ohm load 416. FIG. 28 shows a detector diode 461 connected into the series connected amplifier output to form a detected RF output. These chips show a dual input amplifier with the built-in switch. One of the input ports could be terminated in the 50 ohm load as illustrated, while the dual input amplifier with a built-in switch and detector diode could be used as shown in FIG. 28.

Figure 29:
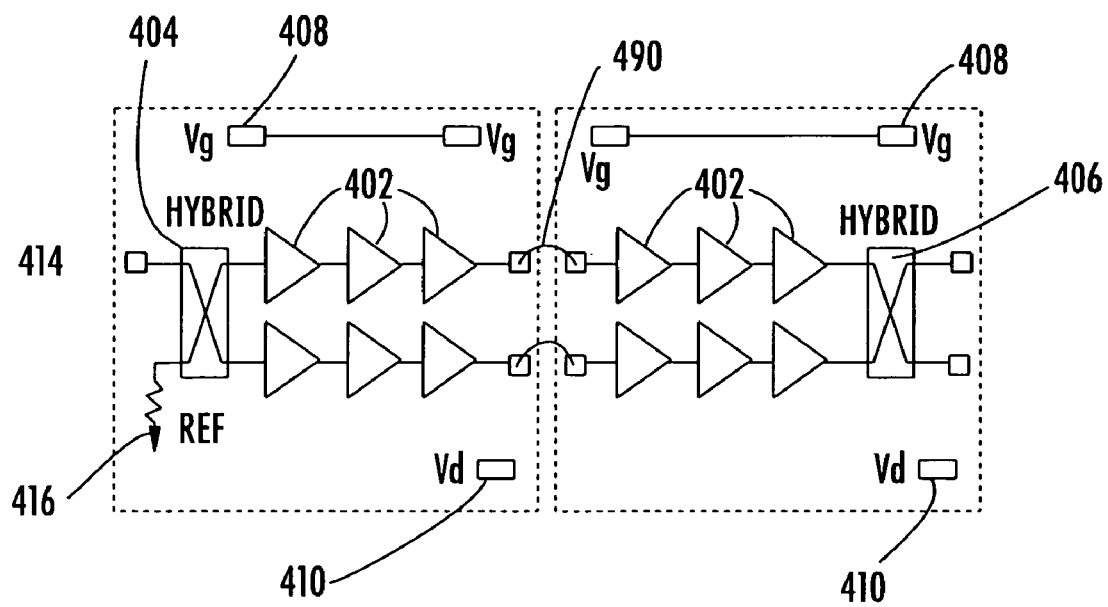
FIG. 29 is an example of a dual MMIC ship LNA in accordance with one non-limiting example of the present inventors.

These chips can be cascaded and combined in various topologies such as shown in FIG. 29, using a ribbon bond 490 as illustrated, to have plukable load layout and a balanced three stage or single-ended three stage configuration with a channel-to-channel isolation. It is also possible to cascade three balance three stage amplifier MMIC's.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A MMIC comprising:
at least one quadrature hybrid;
a plurality of series connected amplifiers connected in two parallel gain stages and operatively connected to said at least one quadrature hybrid such that gain is equalized in the two parallel gain stages;
an output quadrature hybrid operatively connected to said series connected amplifiers for receiving amplified signals from said series connected amplifiers;
at least one RF output at said output quadrature hybrid; and
a load and RF air bridge operative with at least one RF output at said output quadrature hybrid.

2. A MMIC circuit comprising:
a first MMIC having an input quadrature hybrid and dual RF inputs and a plurality of series connected amplifiers connected in two parallel gain stages to said input quadrature hybrid and forming dual RF outputs;
a second MMIC operatively connected to said dual RF outputs of said first MMIC and comprising a plurality of series connected amplifiers connected in two parallel gain stages to said dual RF outputs of said first MMIC and an output quadrature hybrid operatively connected to said series connected amplifiers and having at least one output wherein gain is equalized by the two parallel gain stages in first and second MMIC's.

3. A MMIC circuit according to claim 2, and further comprising a ribbon bond connecting dual RF outputs of said first MMIC and said series connected amplifiers of said second MMIC.

4. A reconfigurable MMIC comprising:
an input quadrature hybrid having a radio frequency (RE) input and an input that includes a RF bridge and termination resistor;
a plurality of series connected amplifiers connected in two parallel gain stages and operatively connected to said input quadrature hybrid; and
an output quadrature hybrid operatively connected to said series connected amplifiers for receiving amplified signals therefrom, and including an RF output and an output having a RF bridge and termination resistor, wherein said termination resistors can be selectively disconnected after testing for transforming the MMIC from a two port MMIC having one RF input and one RF output to a three or four port MMIC with one or two RF inputs and one or two RF outputs.

5. A MMIC comprising:
at least one quadrature hybrid;
a plurality of series connected amplifiers connected in two parallel gain stages and operatively connected to said at least one quadrature hybrid such that gain is equalized in the two parallel gain stages;
an output quadrature hybrid operatively connected to said series connected amplifiers for receiving amplified signals from said series connected amplifiers; and
first and second RF outputs at said output quadrature hybrid and a switch connected to said first and second RF outputs and selecting between first and second RF outputs, and a detector circuit operatively connected to said switch for producing a detected output.

6. A MMIC according to claim 5, and further comprising at least one amplifier operatively connected between said switch and detector circuit.

* * * * *

UNITED STATES PATENT AND TRADEMARK OFFICE
CERTIFICATE OF CORRECTION

| | | |
|---|---|---|
| PATENT NO. | : 7,603,088 B2 | Page 1 of 1 |
| APPLICATION NO. | : 11/301385 | |
| DATED | : October 13, 2009 | |
| INVENTOR(S) | : Danny F. Ammar | |

It is certified that error appears in the above-identified patent and that said Letters Patent is hereby corrected as shown below:

Title Page, (*) Notice: Subject to any disclaimer, the term of this patent is extended or adjusted under 35 U.S.C. 154(b) by 588 days.

should read (*) Notice: Subject to any disclaimer, the term of this patent is extended or adjusted under 35 U.S.C. 154(b) by 892 days.

Signed and Sealed this

Twenty-fifth Day of May, 2010

David J. Kappos
*Director of the United States Patent and Trademark Office*